United States Patent [19]
Croman et al.

[11] Patent Number: 5,990,814
[45] Date of Patent: Nov. 23, 1999

[54] METHOD AND CIRCUIT FOR CALIBRATION OF FLASH ANALOG TO DIGITAL CONVERTERS

[75] Inventors: Russell Croman; Marius Goldenberg, both of Austin; Jerrell P. Hein, Driftwood, all of Tex.

[73] Assignee: Cirrus Logic, Inc., Fremont, Calif.

[21] Appl. No.: 08/924,108

[22] Filed: Sep. 5, 1997

[51] Int. Cl.$^6$ .................................................. H03M 1/06
[52] U.S. Cl. ........................................ 341/118; 341/120
[58] Field of Search .................. 341/118, 120, 341/155

[56] References Cited

U.S. PATENT DOCUMENTS

| | | | |
|---|---|---|---|
| 4,097,860 | 6/1978 | Araseki et al. | 341/118 |
| 4,251,803 | 2/1981 | Debord et al. . | |
| 4,380,005 | 4/1983 | Debord et al. | 341/118 |
| 4,408,349 | 10/1983 | Yukawa | 455/182 |
| 4,547,763 | 10/1985 | Flamm | 341/118 |
| 4,799,041 | 1/1989 | Layton | 341/120 |
| 4,803,382 | 2/1989 | Tanimoto et al. | 307/362 |
| 4,864,437 | 9/1989 | Couse et al. | 360/75 |
| 4,979,055 | 12/1990 | Squires et al. | 360/69 |
| 5,170,299 | 12/1992 | Moon | 360/77.08 |
| 5,255,136 | 10/1993 | Machado et al. | 360/77.02 |
| 5,297,184 | 3/1994 | Behrens et al. | 375/98 |
| 5,321,559 | 6/1994 | Nguyen et al. | 360/46 |
| 5,335,365 | 8/1994 | Ballantyne et al. | 455/76 |
| 5,345,342 | 9/1994 | Abbott et al. | 360/48 |
| 5,384,671 | 1/1995 | Fisher | 360/51 |
| 5,397,936 | 3/1995 | Wang | 327/97 |
| 5,422,760 | 6/1995 | Abbott et al. | 360/46 |
| 5,424,881 | 6/1995 | Behrens et al. | 360/40 |
| 5,459,679 | 10/1995 | Ziperovich | 364/602 |
| 5,572,558 | 11/1996 | Beherns | 375/376 |
| 5,576,904 | 11/1996 | Behrens | 360/51 |
| 5,638,230 | 6/1997 | Kadlec | 360/78.04 |
| 5,642,243 | 6/1997 | Bliss | 360/51 |

FOREIGN PATENT DOCUMENTS 0 297 818   4/1989   European Pat. Off. .
0 637 135   2/1995   European Pat. Off. .

OTHER PUBLICATIONS

McCall, K. J. et al., "A 6–bit 125 MH CMOS A/D Converter", Proceedings of the Custom Integrated Circuits Conference, Boston, May 3–6, 1992, No. Conf. 14; pp. 16.8.1–16.8.4, XP000340926, *IEEE*.

Glincman, M., "CMOS/SOS Flash ADC Speeds on Low Power for Low Cost", *Electronic Design*, vol. 28, No. 24, Nov. 1980, pp. 227–231, XP002086479, Hasbrook Heights, NJ.

International Search Report, Jan. 22, 1999.

International Search Report, Dec. 18, 1998.

Cideciyan et al., "A PRML System for Digital Magnetic Recording," *IEEE J. on Sel. Com..*, 10, Jan. 1992.

Coker et al., "Implementation of PRML in a Rigid Disk Drive," *IBM Storage Systems Products Division*, Manuscript received Jul. 7, 1991.

fields et al., "SA 19.1: A 200Mb/s CMOS EPRML Channel with Integrated Servo Demodulator for Magnetic Hard Disks," *IEEE Int'l Solid–State Circuits Conf*, Feb. 8, 1997.

Goodenough, "DSP Technique Nearly Doubles Disk Capacity," *Electronic Design*, 53–57,Feb. 4, 1993.

(List continued on next page.)

*Primary Examiner*—Marc S. Hoff
*Attorney, Agent, or Firm*—Richard D. Egan; Dan A. Shifrin

[57] ABSTRACT

A system and method for correcting comparator offsets which occur during operating conditions such that static and dynamic offsets are compensated is provided. The comparator may be calibrated for normal operating conditions. The calibration may be accomplished by providing adjustability of the comparators' threshold value and providing a feedback loop for adjusting the threshold value. In one preferred embodiment, the comparator may be utilized within a flash ADC, and in a more preferred embodiment, the comparator may be utilized within a flash ADC of a read/write channel circuit.

23 Claims, 13 Drawing Sheets

OTHER PUBLICATIONS

Reed et al., "Performance of A d=0 Demod/Remod Detector With Partial Erasure Matching," *Cirrus Logic,* Manuscript received Feb. 4, 1997.

Spalding et al., "SA 19.5: A 200Msample/s 6b Flash ADC in 0.6 µm CMOS," *IEEE International Solid–State Circuits Conference,* Feb. 10, 1996.

Spurbeck et al., "Interpolated Timing Recovery for Hard Disk Drive Read Channels," *IEEE,* Aug., 1997.

Tuttle et al., "TP 4.2: A 130Mb/s PRML Read/Write Channel with Digital–Servo Detection," IEEE International Solid–State Circuits Conference, Feb. 8, 1996.

Vanderkooy et al., "Resolution Below the Least Significant Bit in Digital Systems with Dither," *J. Audio Eng. Soc.,* 32(3), Mar. 1984.

Welland et al., "FA 17.1: A Digital Read/Write Channel with EEPR4 Detection," *IEEE International Solid–State Circuits Conference,* Feb. 18, 1994.

Welland et al., "Implementation of a Digital Read/Write Channel with EEPR4 Detection," *IEEE Transactions, Magnetics*; 31(2), Mar. 1995.

Welland et al., "Implementation of a Digital Read/Write Channel with EEPR4 Detection,"—Outline; Crystal Semiconductor Corporation and Cirrus Logic; TMRC '94 Session:F2.

Yamasaki et al., SA 19.2: A 1,7 Code EEPR4 Read Channel IC with an Analog Noise Whitened Detector, *IEEE International Solid–State Circuits Conference,* Feb. 8, 1997.

METHOD AND CIRCUIT FOR CALIBRATION OF FLASH ANALOG TO DIGITAL CONVERTERS

BACKGROUND OF INVENTION

1. Field of Invention

This invention relates to calibration of flash analog to digital converters, and more particularly relates to calibration of flash analog to digital converters utilized in data storage systems such as, for example, magnetic disk storage systems having read/write channel circuits.

2. Description of Related Art

In data storage systems data is stored on a storage media such as a CD-ROM, writable CD, DVD or other optical disk, magnetic tape, magnetic hard disk, etc. Typically, when data is read from the storage media, some form of data detection circuitry is utilized to process the signal generated from the storage media. In magnetic disk storage systems for computers, such as hard drives, digital data serves to modulate the current in a read/write head coil so that a sequence of corresponding magnetic flux transitions are written on a magnetic medium in concentric tracks. To read this recorded data, the read/write head passes over the magnetic medium and transduces the recorded magnetic transmissions into a signal of an analog nature that contains pulses that alternate in polarity. These pulses are then decoded by read/write channel circuitry to reproduce the digital data.

Decoding the pulses into a digital sequence can be performed by a simple peak detector in an analog read channel or, as in more recent designs, by using a discrete time sequence detector in a sampled amplitude read channel. Discrete time sequence detectors are preferred over simple analog pulse detectors because they compensate for intersymbol interferences (ISI) and, therefore, can recover pulses recorded at high densities. As a result, discrete time sequence detectors increase the capacity and reliability of the storage system.

There are several well known discrete time sequence detection methods for use in a sampled amplitude read/write channel circuit including discrete time pulse detection (DPD), partial response (PR) with Viterbi detection, partial response maximum likelihood (PRML) sequence detection, decision-feedback equalization (DFE), enhanced decision-feedback equalization (EDFE), and fixed-delay tree-search with decision-feedback (FDTSIDF). When discrete methods are utilized for sampled amplitude read channel systems, an analog to digital converter (ADC) is typically utilized to convert the high frequency data which is contained on disk.

One type of ADC which may be utilized to convert high frequency disk data is a flash ADC. Such an ADC may contain multiple comparators for conversion of the analog data to digital data. In order to accurately convert the high frequency analog data, it is desirable that the comparators exhibit very little electrical variation from ideal operation even in the presence of "offsets". Many sources exists for offsets including mismatch between two devices (for example transistors, resistors, capacitors, etc.) which though intended to be identical, vary to one degree or another due to limitations of fabrication processes.

One approach to compensate for such offsets is to utilize a DC auto-zero operation. FIG. 1 illustrates an example of an auto-zero operation for use with an amplifier of a flash ADC comparator. As shown in FIG. 1, a comparator having input voltages $V_{in1}$ and $V_{in2}$, differential transistors $M_1$ and $M_2$, and outputs $V_{o1}$ and $V_2$ are provided. In normal operation, switches $S_1$ and $S_2$ are connected to $V_{in1}$ and $V_{in2}$ respectively and switches $S_3$ and $S_4$ are open. For auto-zero operation, the switches $S_1$ and $S_2$ are connected to $V_{ref1}$, and $V_{ref2}$ respectively and switches $S_3$ and $S_4$ are closed. Control of the switches in this manner during auto-zero operation will bias the capacitive nodes $V_{o1}$ and $V_{o2}$ with the effect that the amplifier stage is biased such the output voltage ($V_{o1}-V_{o2}$) is substantially zero with an input voltage differential of $V_{ref1}-V_{ref2}$.

Auto-zero schemes such as described above have disadvantages in that only DC (or static) mismatches are accounted for and dynamic mismatches (from, for example, different parasitic capacitances, differential charge injection from the switches, etc.) are not corrected. Thus, during actual operation of the amplifier (as opposed to a DC auto-zero situation where the inputs are not changing) offsets will still result. Moreover the auto-zero scheme described above does not address the use of comparators having multiple amplifier stages as the DC offset of the first stage may be accounted for, but the offsets of subsequent stages are not corrected.

SUMMARY OF INVENTION

This invention addresses one or more of the problems and disadvantages described above. In one broad respect, the invention may include a system and method for correcting comparator offsets which occur during operating conditions such that static and dynamic offsets are compensated. Thus, the comparator may be calibrated for normal operating conditions which including operating the comparator with actual ADC clock and control signals. The calibration may be accomplished by providing adjustability of the comparators' threshold value and providing a feedback loop for adjusting the threshold value. In one preferred embodiment, the comparator may be utilized within a flash ADC, and in a more preferred embodiment, the comparator may be utilized within a flash ADC of a read/write channel circuit.

In one embodiment, a method of calibrating a comparator of an ADC circuit is provided. The method may include providing an ADC circuit having at least one comparator circuit, operating the comparator, and calibrating the comparator by correcting dynamic offsets while the comparator is operating. Further the method may include compensating for offsets by performing an auto-zero operation. The method also includes operating the comparator at actual operating clock speeds to determine a dynamic offset, adjusting by an incremental amount an electrical signal at at least one node of the ADC circuit to lessen the dynamic offset, and repeating the adjusting step until the dynamic offset is sufficiently corrected or until the adjusting step has been repeated a predetermined number times or repeated for a predetermined length of time.

In another embodiment, a method of operating a data detection circuit, includes receiving an input data signal from a data storage medium and coupling the input data signal to a sampling circuit. The sampling circuit may include a plurality of comparators. At least one of the comparators are intermittently calibrated, at least a portion of the calibration being performed while the at least one comparator is being clocked. The data detection circuit may be a read channel circuit and the data storage medium may be a disk storage medium. Further, the method may include performing the calibrating step while said comparator is being operated at actual operating frequencies and performing the calibrating step at intermittent periods which correspond to the beginning or ending of the sampling of a segment of data from the disk, each of the comparators being calibrated during the intermittent periods.

In yet another embodiment, a comparator for use in an ADC is provided. The comparator may include a comparator input coupled to an ADC input, a comparator output, an amplifier coupled to the comparator input and the comparator output, and offset control circuitry. The offset control circuitry provides a control loop around the comparator for calibrating dynamic offsets of the comparator while the comparator is operating. The comparator may also have a control node coupled to an input of the amplifier, an electrical parameter at the control node being adjusted to calibrate dynamic offsets of the comparator.

In another embodiment, a data detection system is provided. The data detection system may include an input coupled to a data storage medium, the input receiving a data stream from the data storage medium. The system further includes an analog to digital converter coupled to the input and at least one comparator within the analog to digital converter. An amplifier is provided within the comparator, at least one node of the comparator coupled to an input of the amplifier. An offset control loop is coupled to the at least one node and coupled to an output of the amplifier, the offset control loop operating while the comparator is being clocked to adjust an electrical parameter at the at least one node so that dynamic offsets of the comparator may be calibrated. The offset control loop may include an offset detection circuit for determining the polarity of the dynamic offset of the comparator, and an adjustment circuit for adjusting the value of the electrical parameter at the at least one node in response to the dynamic offset detected by the offset detection circuit. The adjustment circuit may include a capacitor switchably coupled to the at least one node, and at least one voltage source switchably coupled to the capacitor.

BRIEF DESCRIPTION FO THE DRAWINGS

DESCRIPTION OF THE PREFERRED EMBODIMENTS

Figure 2:
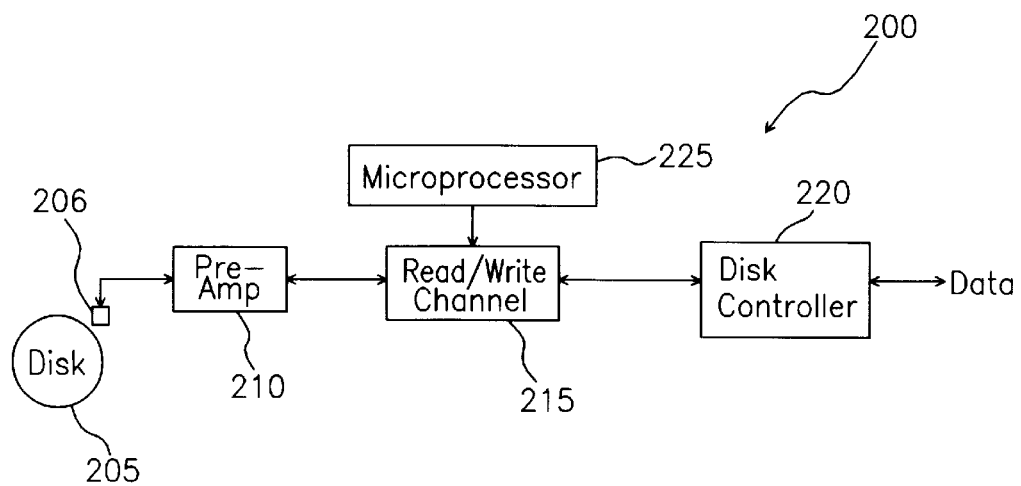
FIG. 2 is a block diagram of a disk drive system.

FIG. 2 illustrates a data storage system 200 (for example a disk drive system) in which the present invention may be utilized. The disk drive system may include a disk 205, a read/write head 206, a pre-amp 210, a data detection/write circuit, a microprocessor 225, and a disk controller 220. The data detection/write circuit may be, for example, a read/write channel circuit 215. The disk 205, the read/write head 206, the pre-amp 210, the microprocessor 225, and the disk controller 220 may be implemented individually or in combination through the use of any of a wide variety of commercially available components. For example, the microprocessor may be a general 8-bit microprocessor, the disk controller may be a user's own custom ASIC or a commercially available controller such as the SH7600 available from Cirrus Logic, and the disk 205 and read/write head 206 may be any of a number of hard disks and heads available from hard disk manufacturers.

Data is read and written to the disk 205 by the head 206 which receives and transmits the data through a data path which includes the disk controller 220, the read/write channel circuit 215 and the preamp 210. The data storage system 200 shown in FIG. 2 is just one illustrative example of a data storage system. Other data storage systems may also utilize the present invention. Further, though shown separately, various components of the data storage system may be combined or additional components may be considered to be part of the system including components such as RAM, ROM, power supply circuits, and other circuits. In addition, though shown as separate from a host computer, the data storage system may be integrally formed within a computer or alternatively, the data storage system may be formed as a stand alone unit independent of a host computer. Though shown herein with reference to a magnetic disk drive system, other data storage systems, for example optical disk drive systems, may also utilize the present invention. Moreover, certain features of the present invention are not limited to the use of data storage systems and may be utilized in many other electronic circuits in which analog to digital converters, comparators, or amplifiers are present.

Figure 3:
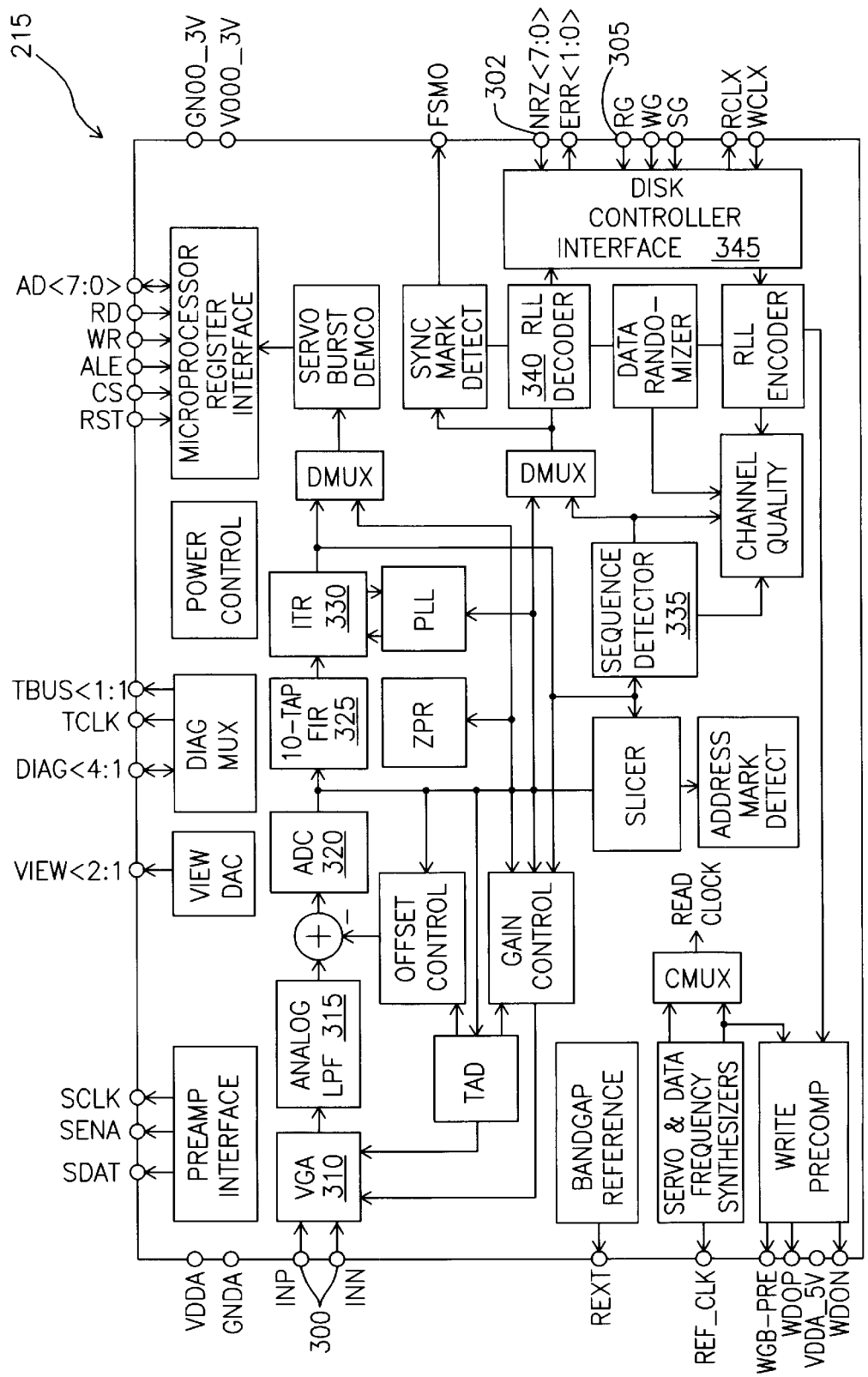
FIG. 3 is a block diagram of a read/write circuit.

FIG. 3 is a functional block diagram of the read/write channel circuit 215 of FIG. 2 implemented as a read/write channel. The read/write channel circuit 215 includes circuits for both the write path and the read path. Though a read/write channel circuit 215 is shown in FIGS. 2 and 3, the present invention may also be utilized in a circuit that does not include both read and write circuitry (i.e. a read channel only or write channel only circuit). Thus, as used herein a read/write channel circuit may include circuits that have read only, write only, both read and write functions or additional functions. Moreover, it will be recognized that the read/write channel circuit 215 is just one exemplary circuit which may incorporate the materials disclosed herein, and other read/write channel circuits may also utilized the disclosures made herein.

In FIG. 3, data may be presented from the preamplifier 210 at the INP and INN pins 300. The read mode (i.e. when data is being presented from the disk through the pre-amp through the read/write channel circuit to the disk controller)

may be indicated through the use of a read signal on the RG pin 305. Read operations may be clocked by a frequency synthesizer, for example, a synthesizer as disclosed in U.S. patent application Ser. No. 08/924,190, entitled "Method And System To Improve Synthesizer Settling Times For Small Frequency Steps In Read Channel Circuits", to G. Diwakar Vishakhadatta and Jerrell P. Hein, filed concurrently with the present invention, the disclosure of which is expressly incorporated herein by reference. Read data may be presented from the read/write channel circuit 215 data bus pins 302 (NRZ<7:0>) to the disk controller. The analog read signal from the pre-amplifier (the signal at the INP and INN input pins 300) is provided to a variable gain amplifier (VGA) 310 to achieve a constant amplitude at the input to an analog low pass filter (LPF) 315. The output of the LPF 315 is provided to a sampling circuit which generates digital samples of the filtered signal. As shown in FIG. 3, the sampling circuit may be an ADC 320. The ADC 320 outputs may then be filtered through a digital finite impulse response equalization filter (FIR) 325 and a interpolated timing recovery filter (ITR) 330 to condition the signal to achieve a PR4 target and produce synchronous samples by digital interpolation of the asynchronous sample stream respectively. The ITR 330 output may be provided to a sequence detector 335 and then to the RLL decoder 340. Finally the read operation output may be provided through a disk controller interface 345 to the data bus pins 302. Though FIGS. 2 and 3 illustrate an example read/write channel circuit 215, the present invention may be utilized in a circuit that does not include write circuitry (i.e. a read channel only circuit). Thus, as used herein a read channel circuit may indicate a read channel only circuit or a circuit that includes read and write functions (read/write channel circuit) or additional functions.

Figure 4:
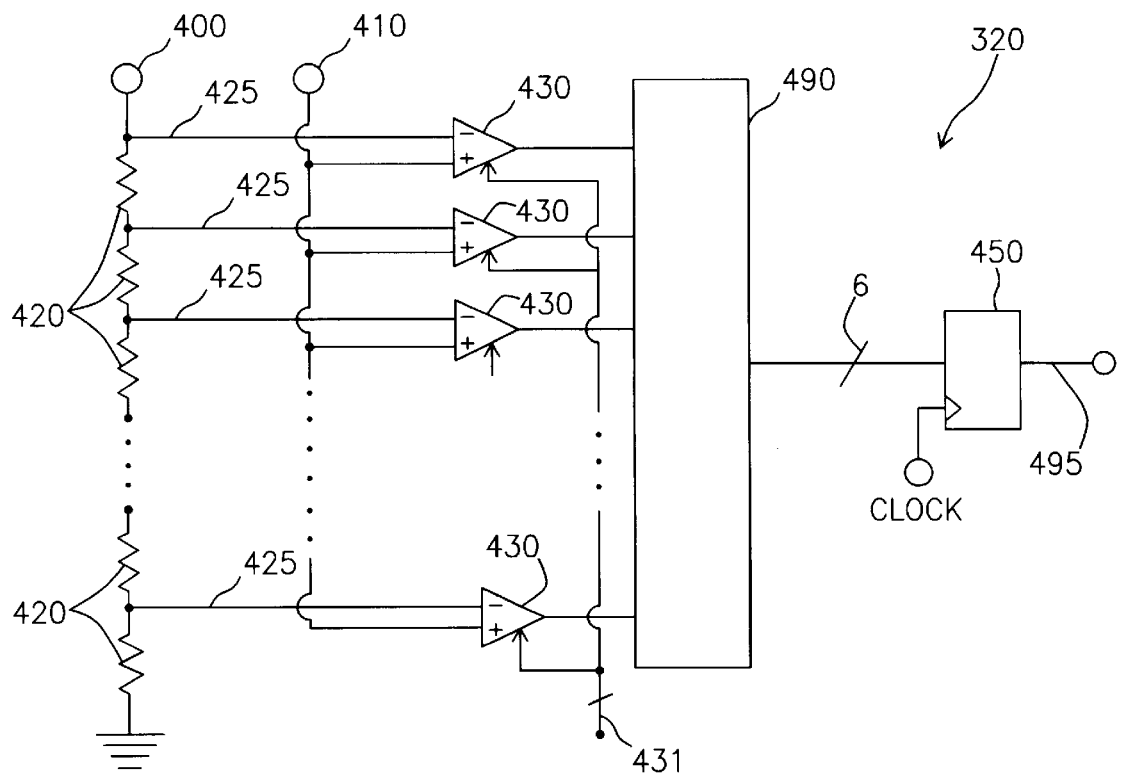
FIGS. 4 and 4A are block diagrams of a flash ADC.

The ADC 320 may be designed in a number of manners. For example, the ADC 320 may be a six bit flash ADC. An exemplary six bit flash ADC 320 is shown in FIG. 4. The ADC 320 of the embodiment of FIG. 4 may include an analog input 410 and a reference voltage input 400. The reference voltage is then divided into separate voltages through a series of resistors 420 which form a resistor voltage divider. Output taps are then provided from the resistor voltage divider to provide reference voltage inputs 425 to a series of comparators 430. In one embodiment, sixty-three separate voltages may be provided through sixty-three resistors 420 (each voltage varying by 1/64 of the reference voltage from the adjacent resistor) to sixty-three comparators 430. The analog input which is to be converted to a digital value is provided through input 410 to each of the comparators 430. Each comparator receives control signals as shown by control bus line 431. The control signal may include a clock signal operating at the system read operation clock speed (for example typically between 50 and 350 MHz) and other control signals such as those shown in FIGS. 11 and 12. The output of each comparator is a digital value which indicates whether the analog input 410 is greater than or less than the voltage on the reference voltage input 425 that is coupled to the comparator. The outputs of the comparators 430 are then provided to digital logic 490. By observing where the outputs of the comparators 430 change from one digital state to the other, the digital logic 490 determines which two reference voltages that the analog input lies between and provides a 6-bit digital representation of a voltage that represents, for example, the lower or higher reference voltage or a midpoint voltage. This 6-bit output may then be provided at output 495 through clocked D flip-flops 450.

Figure 4A:
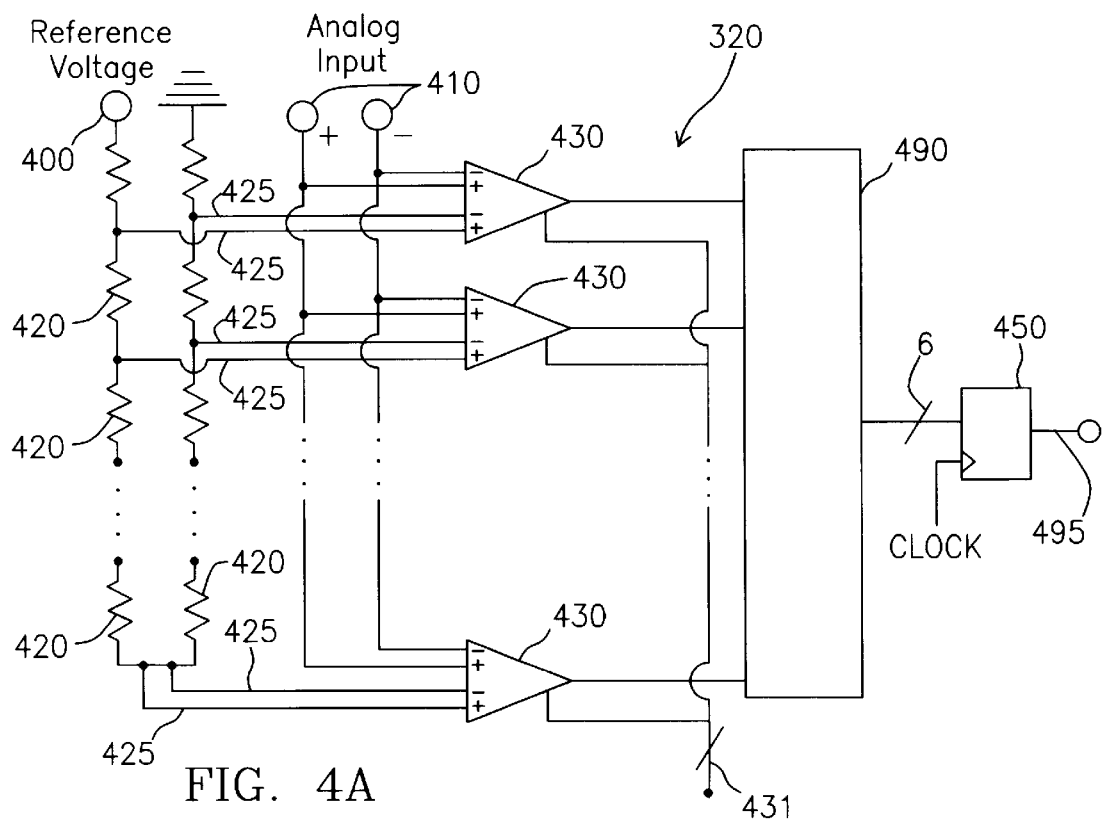

Though the input voltages and reference voltages to the comparators of FIG. 4 are shown as single ended, it will be recognized that differential inputs and reference voltages may be utilized. For example, FIG. 4A illustrates a differential input version of the ADC of FIG. 4. As shown in FIG. 4A, differential inputs are provided for the reference voltage inputs 425 and the analog inputs 410. The reference voltage inputs 425 may be generated from a folded string of resistors 420 as shown. It will also be recognized that the present invention may be utilized with other ADC circuits and other comparator circuits in addition to those disclosed herein.

Sliced Integration

Figure 6:
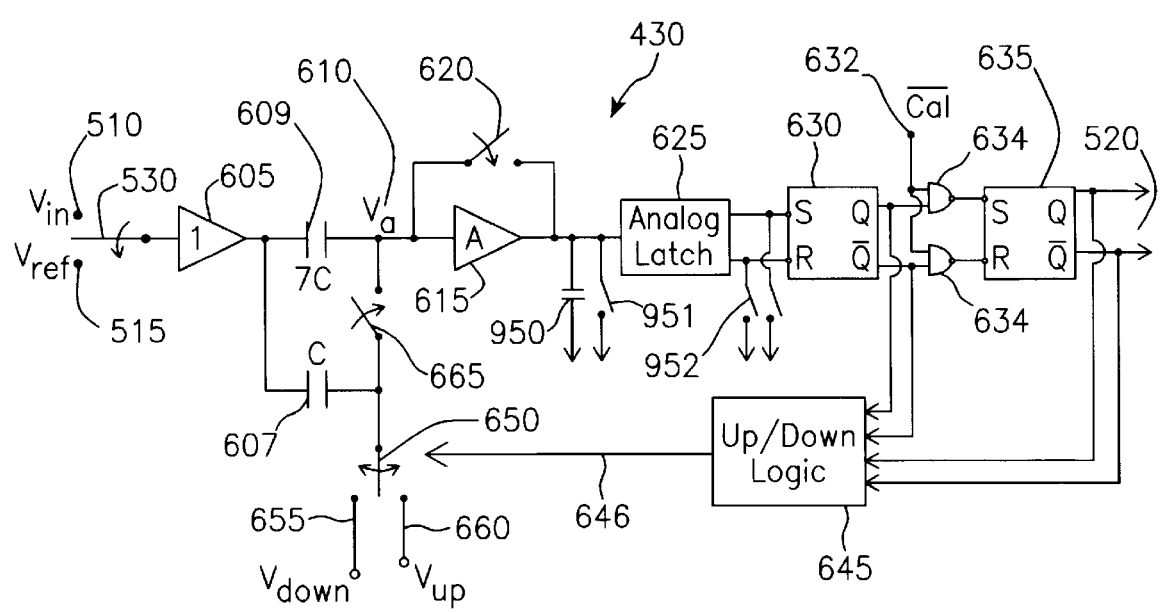
FIG. 6 is a more detailed circuit diagram of the circuit of FIG. 5.
Figure 9:
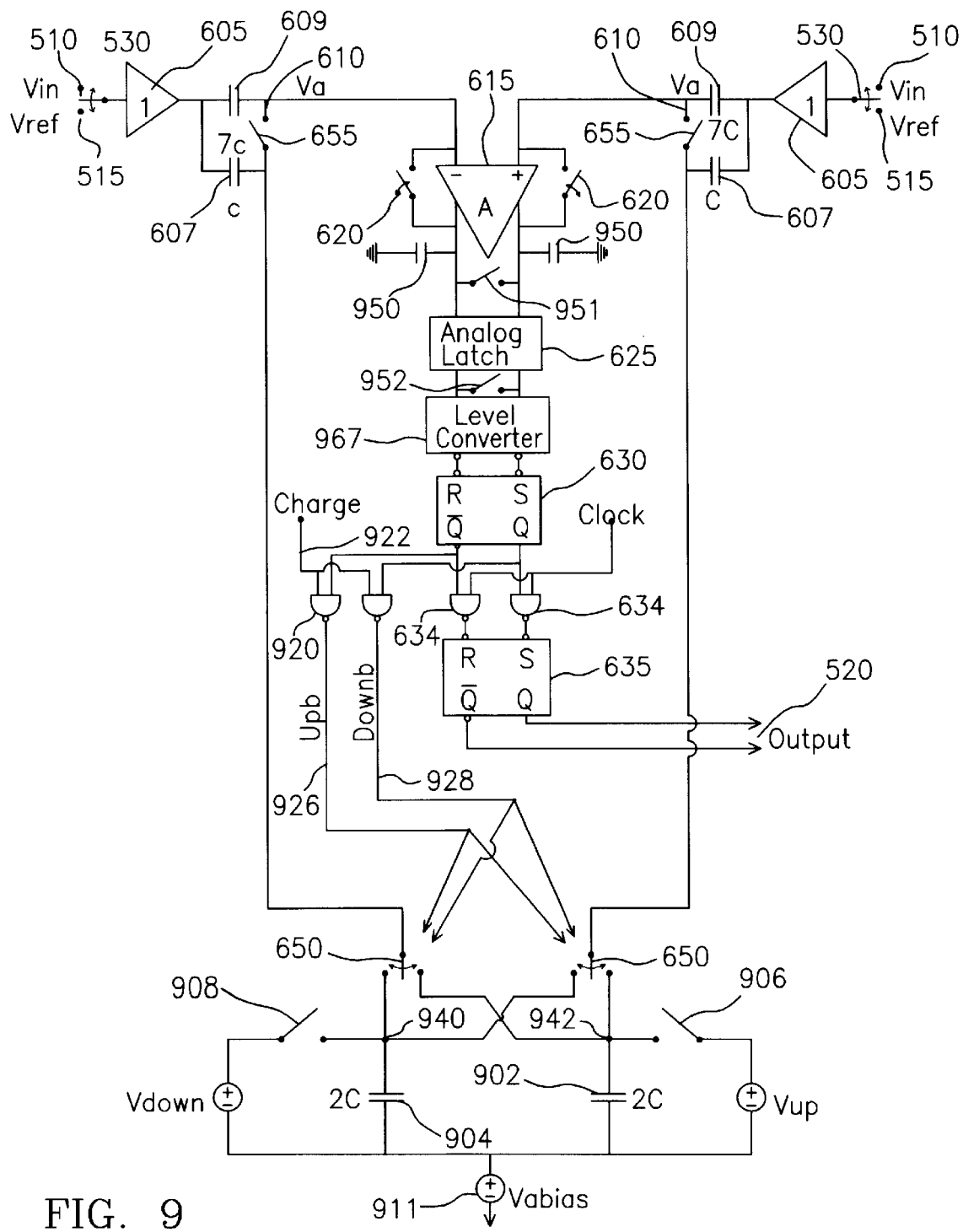
FIG. 9 is one embodiment of a circuit for implementing the calibration techniques disclosed herein.

A circuit for implementing a comparator 430 is shown in FIG. 9. An alternative circuit for implementing the comparator 430 is shown in FIG. 6 as a single ended circuit for conceptual purposes. The circuits of FIG. 9 and 6 both utilize the same comparison techniques, however, the circuits illustrate alternative calibration techniques as discussed below. As shown in FIG. 9, $V_{in}$ inputs 510 and $V_{ref}$ inputs 515 are selectively connected to the comparator through the input switches 530 for providing the input signal to be converted and reference voltages respectively. The switches 530 are connected to buffer amplifiers 605 which each have an output connected to two capacitors 607 and 609. The capacitors 609 are also connected to voltage nodes 610 ($V_a$). Thus, the comparator input is AC coupled to voltage nodes 610 ($V_a$). The capacitors 607 have a capacitance value of C while the capacitors 609 have a capacitance value seven times the value of C. The buffer amplifiers 605 serve to isolate the ADC comparators 430 from each other so that loading effects between comparators and other interactions are minimized (particularly while performing the calibration operations discussed below). The voltage nodes 610 are provided as inputs to an integrating amplifier 615 which has a transconductance of $g_m$. A capacitor 950 is shown connected to each output of the integrating amplifier 615. Though shown for conceptual purposes as discrete capacitors, as will be discussed in more detail below the capacitors 950 need not be capacitor separate from the amplifier, but rather may result from the parasitic capacitances of a variety of the amplifier transistors. Switches 951, which are controlled by an AMP signal, may be considered part of the amplifier 615. Switch 952 is controlled by an inverse of the LATCH signal, the LATCHB signal. Switch 952 and the level converter may be considered part of the analog latch as shown in more detail in FIG. 9A (for example, transistors 844, 842, 858, and 852 of FIG. 9A).

Switches 620 operate as reset switches and are closed as shown by the arrow during the auto-zero sequence. The switches 620 are reopened when the auto-zero operation is completed. The output of integrating amplifier 615 is provided to an analog latch 625 which provides an output to a digital latch 630. The output of the digital latch 630 is provided through NAND gates 634 to a second digital latch 635. The outputs of the second digital latch 635 provide the outputs 520 of the entire comparator structure. These outputs 520 may then be provided to encoding logic 490 such as shown in FIG. 4. The circuits and structures of the calibration loop from the outputs of the latch 630 to the control nodes 610 are discussed in more detail below.

Figure 1:
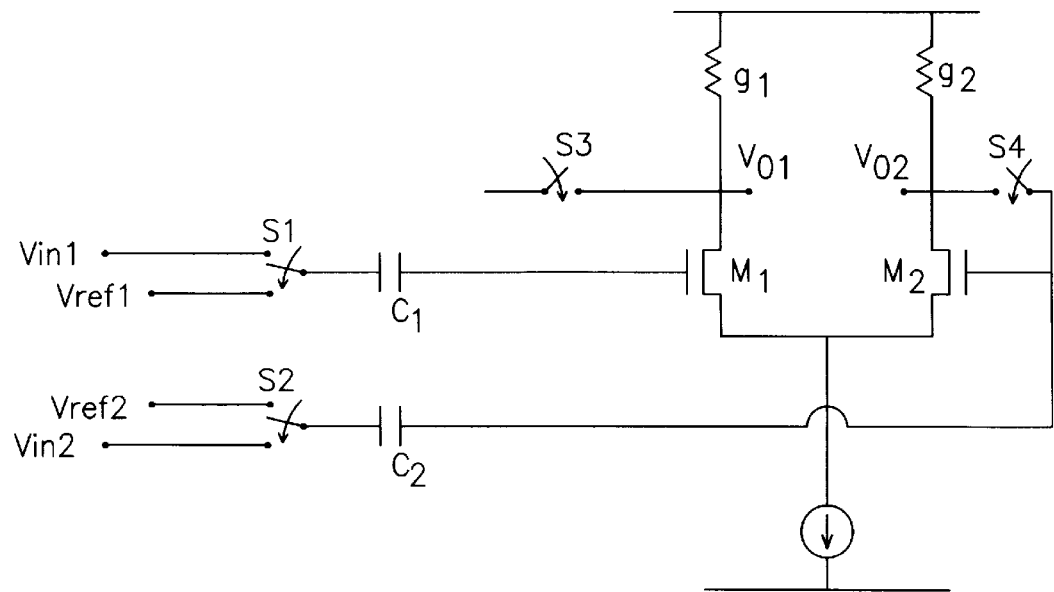
FIG. 1 illustrates a prior art circuit for implementing ADC auto-zero techniques

The comparison operations of the circuit of FIG. 9 will be discussed with reference to the circuit when the circuit is operating in a comparison operation mode rather than a calibration mode. Initially the reference voltages $V_{ref}$ 515 are connected to the circuit through switches 530 while auto-zero switch 620 is closed as described in more detail below (with reference to calibration). Prior to beginning the comparison mode, the auto-zero switch 620 is then opened again. This initial connection of the reference voltages generates a voltage of $V_{ref}$ on the capacitors 609 which remains present when the comparator input is changed to the $V_{in}$ signal source. Thus, when comparisons are being performed the capacitors 609 may be considered to be floating constant voltage sources. This series connection of voltage sources generates the input voltages at node 610 ($V_a$) for the integrating amplifier 615. The $V_{in}$ input signals 510, which are the ADC input signal, represents the signal applied at the non-inverting input of the comparator. There is no inverting input to this comparator. By construction, this comparator will compare its input voltage to 0. The floating constant voltage sources, the capacitors 609, shift the voltage threshold of the comparator from 0. In this way, instead of comparing the input signal to 0, the comparator is comparing the input signal to the voltage $V_{ref}$. This effectively achieves the result of the typical comparator (FIG. 1) which has the input signal connected at the non-inverting input and the reference voltage connected at the inverting input.

It should be noted that there is not a track-and-hold operation performed at the input to the integrating amplifier of FIG. 9. After the $V_{ref}$ voltage is transferred to the capacitors, the input signal is continuously connected at the input of the integrating amplifier and is allowed to swing freely during the comparison operation. This is in contrast with the classical implementation of a comparator which relies on the fact that the input signal remains constant for the entire duration of the comparison in order to achieve an accurate decision.

Figure 9A:
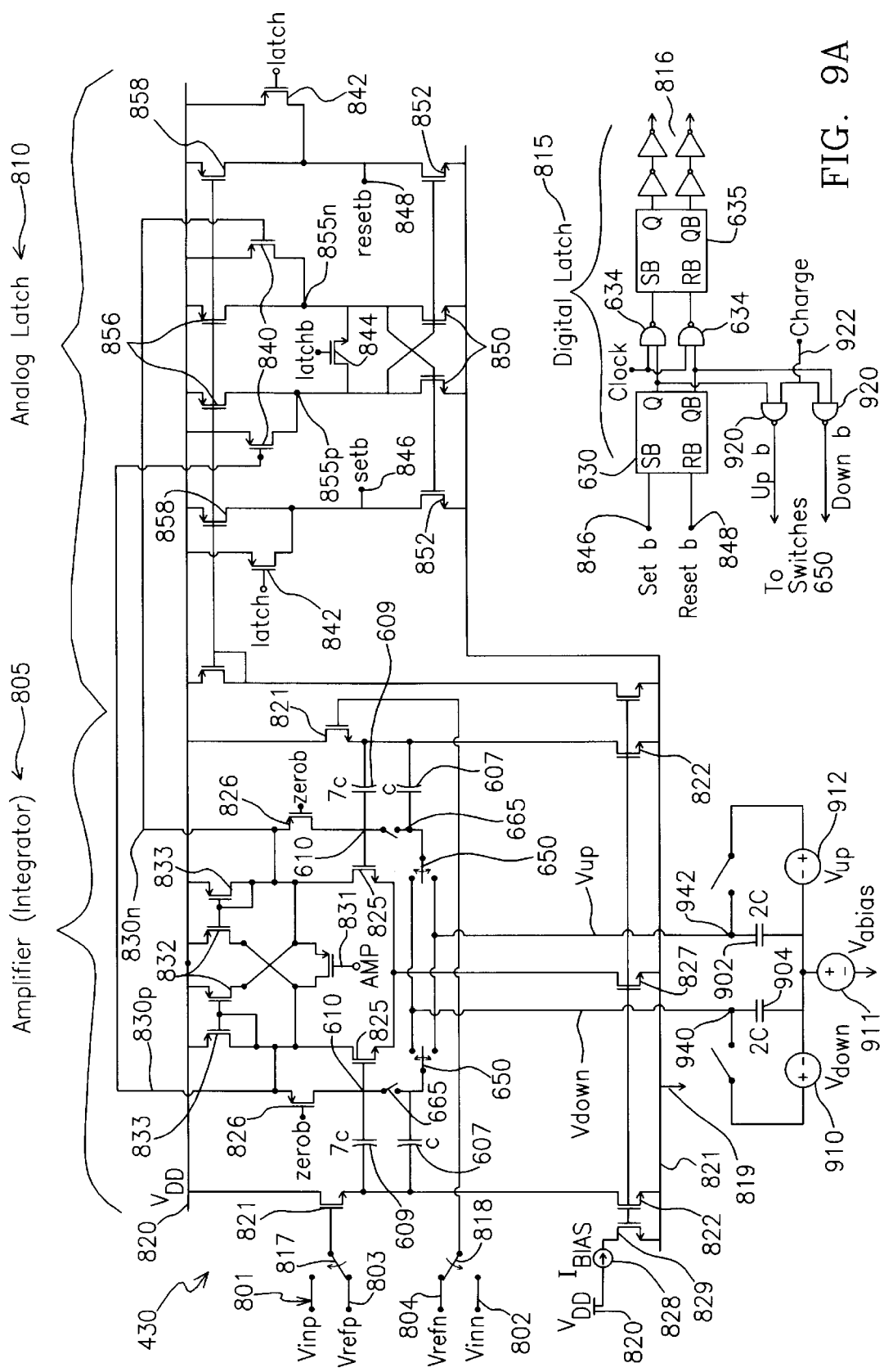
FIG. 9A is another exemplary circuit for accomplishing the ADC calibration techniques according to the present invention.

One preferred embodiment for use as the comparator 430 is shown in FIG. 9A. As shown in FIG. 9A, the comparator 430 may include three circuit blocks, such as an integrating amplifier 805, an analog latch 810, and a digital latch 815. The inputs to the comparator 430 may be differential inputs, such as analog voltage inputs $V_{inp}$ 801 and $V_{inn}$ 802 and the reference voltage input $V_{refp}$ 803 and $V_{refn}$ 804. Input switches 817 and 818 are provided for selecting which of the inputs are connected to the comparator 430. The comparator also has an output 816 which may be provided to digital encoding logic, such as digital logic 490 of FIG. 4.

The signals at the inputs of the comparator 430 are first provided to the integrating amplifier 805. The integrating amplifier or 805 is of symmetrical design for the side of the integrating amplifier with like reference numbers utilized in FIG. 9A for each symmetrical circuit element. The inputs to the integrating amplifier 805 are first provided to a pair of input transistors 821. The input transistors 821 perform the buffer function of amplifier 605 of FIG. 9. The input transistors 821 are connected between $V_{DD}$ 820 and transistors 822. Transistors 822 are also connected to ground 819. The input transistors 821 are also ac coupled to integrating amplifier differential transistor pair 825 through capacitors 609. Capacitors 609 may have a capacitance value of 7C as shown in FIG. 9A. In one preferred embodiment, the value of 8C may be 0.300 pF (300 fF). The capacitors shown herein may be formed from n-channel transistors connected as a capacitor. As described below, pump switch 665 is selectively opened or closed to isolate and connect capacitors 609 and 607 and switch 650 is selectively applied to the voltage up input 660 or the voltage down input 655 as needed during calibration. However, during standard comparison operations switches 665 are left open.

The capacitors 609 are also connected to voltage nodes 610 ($V_a$), which operate as the voltage nodes 610 of FIG. 9.

The voltage nodes 610 are also connected to the gates of differential transistors 825. One side of each differential transistors 825 is coupled together and to transistor 827. The other side of each transistor 825 provides the output of the integrating amplifier 805 via output lines 830P and 830N which are provided to the analog latch circuitry 810. Connected between the gate of each transistor 825 and the outputs 830 is a transistor 826. Transistor 826 operates to perform the function of the auto-zero switches 620 of FIG. 9. The input to each transistor 826 is the ZEROB signal which indicates when the auto-zero step of the calibration sequence is to be performed.

In operation, the output currents of the differential transistor pair 825 feed into a cross-coupled p-channel network connected in unity-gain positive feedback. This structure ideally presents an infinite differential impedance to the currents from the differential transistors 825. Thus the differential output voltage of the amplifier will be a time-integration of the differential input voltage, with a time constant determined by the transconductance of the differential pair and the total capacitance at the output nodes. Since this structure has memory, a p-channel switch is included to reset it before each conversion cycle.

More particularly, the integrating amplifier outputs 830P and 830N are coupled together through transistor 831 which is controlled by a gate signal AMP. Transistor 831 operates as the switch 951 of FIG. 9. When the AMP signal goes low, the integrating amplifier 805 is reset. The source and drain of transistor 831 are each also connected to one of a pair of transistors 832 which are controlled by gate signals which are connected to transistors 833 as shown. The parasitic capacitances of transistors 832, 833, 825, 831, 840, and 826 together form the capacitors 950 of FIG. 9. In an exemplary embodiment, the capacitance of capacitor 950 may be approximately 30 fF and the $g_m$ of the integrating amplifier may be 212 micro-siemens which yields a time constant of approximately 141 psecs. The integrating amplifier 805 also includes a bias current source 828 which is connected to a transistor 829. The gates of transistors 829, 822, and 827 are all tied together as shown.

The outputs 830P and 830N of the integrating amplifier 805 are provided to a pair of analog latch input transistors 840. The input transistors 840 are connected between $V_{DD}$ 820 and nodes 855P or 855N as shown. The nodes 855P and 855N are coupled to $V_{DD}$ through transistors 856 and coupled to ground through cross-coupled transistors 850. The gates of transistors 850 are also connected to the gates of transistors 852 as shown while the gates of transistors 856 are also coupled to the gates of transistors 858 as also shown. The analog latch 810 operates in response to a LATCH signal and LATCHB signal. The LATCH signal is provided to transistors 842 while the LATCHB signal is provided to transistor 844. The outputs of the analog latch 810 are provided at output nodes 846 (the SETB signal) and output node 848 (the RESETB signal). The transistor 844 operates as a switch in response to the LATCHB signal such that when the LATCHB signal goes low the connection between nodes 855P and 855N through the transistor 844 is opened and either the SETB or RESETB signal is pulled down hard. This effectively converts the analog voltage level of the amplifier and the analog latch to digital levels compatible with the digital latch. Thus in response to the LATCHB signal, transistor 844 operates as the switch 952 of FIG. 9 and transistors 842, 855, and 858 operate in response to the LATCH signal as the level converter 967 of FIG. 9A.

The SETB and RESETB outputs of the analog latch are provided to the digital latch circuitry 815. The digital latch circuitry 815 may include digital latches 630 and 635, such as SR flip-flops as shown. The outputs of the latch 630 are provided to the NAND gates 634. The NAND gates 634 also receive as inputs the ADC clock signal. The outputs of the NAND gates 634 are provided as inputs to the latch 635. The outputs of the latch 635 are provided through inverters to provide the outputs 816 of the comparator 430.

As mentioned above, the switch 951 of FIG. 9 (which corresponds to transistor 831 of FIG. 9A is controlled by the AMP signal. When the AMP signal is HIGH the switch is opened and the output voltage of the integrating amplifier 615 is free to swing. When the AMP signal is LOW, the integrating amplifier output is forced to 0 (i.e. in the differential embodiment of FIG. 9A there is no differential voltage between the two outputs 830$p$ and 830$n$). Thus, the amplifier is reset to a known condition every conversion cycle, and integration starts from zero for each conversion. The switch 952 of FIG. 9 (which corresponds to transistor 844 of FIG. 9A) is controlled by the LATCH signal inverse, LATCHB to operate as a reset switch for the analog latch. When LATCHB is low, switch 952 is opened and the output of the analog latch will quickly swing up or down depending on the polarity of the signal integrating amplifier 805 outputs 830$p$ and at the moment when switch 952 is released. While the analog latch is inactive, in response to the LATCH signal the transistors 842, 852, and 858 operate as the level converter 967 of FIG. 9 to hold both analog latch outputs high so that the digital latch 630 is in the don't care state. Thus, the final result of the comparison will be exclusively dependent on the polarity of the output of the integrating amplifier 805 at the time instance defined by the rising edge of the LATCH signal (or the falling edge of LATCHB).

Figure 13:
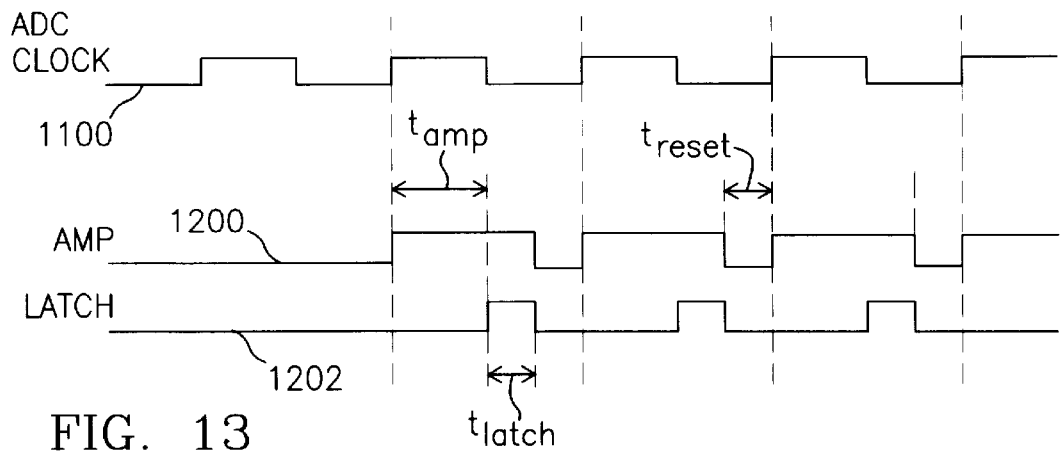
FIGS. 13 and 14 are timing diagrams for the comparator when utilized to perform conversions.

The timing diagram for the signals controlling the comparison process is shown in FIG. 13. When the ADC is to first begin comparisons, the comparator may first be calibrated as discussed below in more detail. The auto-zero and calibration procedures charge the capacitor 609 to provide a floating constant voltage source. The input switch 530 may then be connected to the analog voltage to be sampled, voltage $V_{in}$ 510. As shown in FIG. 13, at the beginning of the comparison cycle both the AMP signal 1200 and the LATCH signal 1202 are LOW. By keeping this signals low, the switches 951 and 952 are kept closed, and thus the integrating amplifier 615 output and the analog latch 625 output are kept at zero, a well defined initial condition.

When the AMP signal goes HIGH, the output of the integrating amplifier 615 is released. The integrating amplifier 615 and the capacitor 950 together form an ideal integrator which will integrate the input signal for the duration of time the AMP signal 1200 stays HIGH. Thus, the output of the integrating amplifier 615 will depart from 0 and will follow a trajectory governed by the integration of the input signal. For the time period that this integration is occurring and the LATCH signal 1202 is low, indicated by $t_{amp}$ on FIG. 13, the output of the analog latch will remain at zero. When the LATCH signal 1202 goes high, the analog latch 625 is released and the output of the analog latch 625 will go to a high or low value depending on what value the output of the amplifier 615 is at (i.e., the value of the integration of the $V_{in}$ signal 510 over the $t_{amp}$ period). The analog latch output may then be synchronized to the ADC system clock through the digital latches 630 and 635 prior to being provided as the comparator output at outputs 520.

After the analog latch is released and its output goes high or low, the output will remain at the value initial latched at the rising edge of the LATCH signal 1202 until the LATCH signal falls. As shown in FIG. 13, the LATCH signal 1202 remains high until the AMP signal 1200 also falls. When the AMP signal 1200 falls, the integrating amplifier 615 is reset to a zero output and is thus ready to commence another comparison. The amplifier reset period is shown in FIG. 13 as $t_{reset}$. In this fashion, the analog input $V_{in}$ 510 is repeatedly sampled and converted to a digital value. Essential to the result of the comparison is the value of the amplifier 615 output voltage when the rising edge of the LATCH signal arrives. In a mathematical sense, the important result is the integration end-point after a fixed amount of time defined by the interval between the rising edge of the AMP signal and the rising edge of the LATCH signal, denoted here as $t_{amp}$. Therefore the integration is executed on $t_{amp}$ wide slices of the input signal and every integration cycle starts from a zero point. Thus, this analog to digital sampling technique may be denoted as a sliced integration technique. The sliced integration technique allows the flash ADC to be implemented without using a front-end track/hold circuit. Further, the sliced integration technique shown herein does not suffer from recovery from overdrive induced distortion problems.

Figure 14:
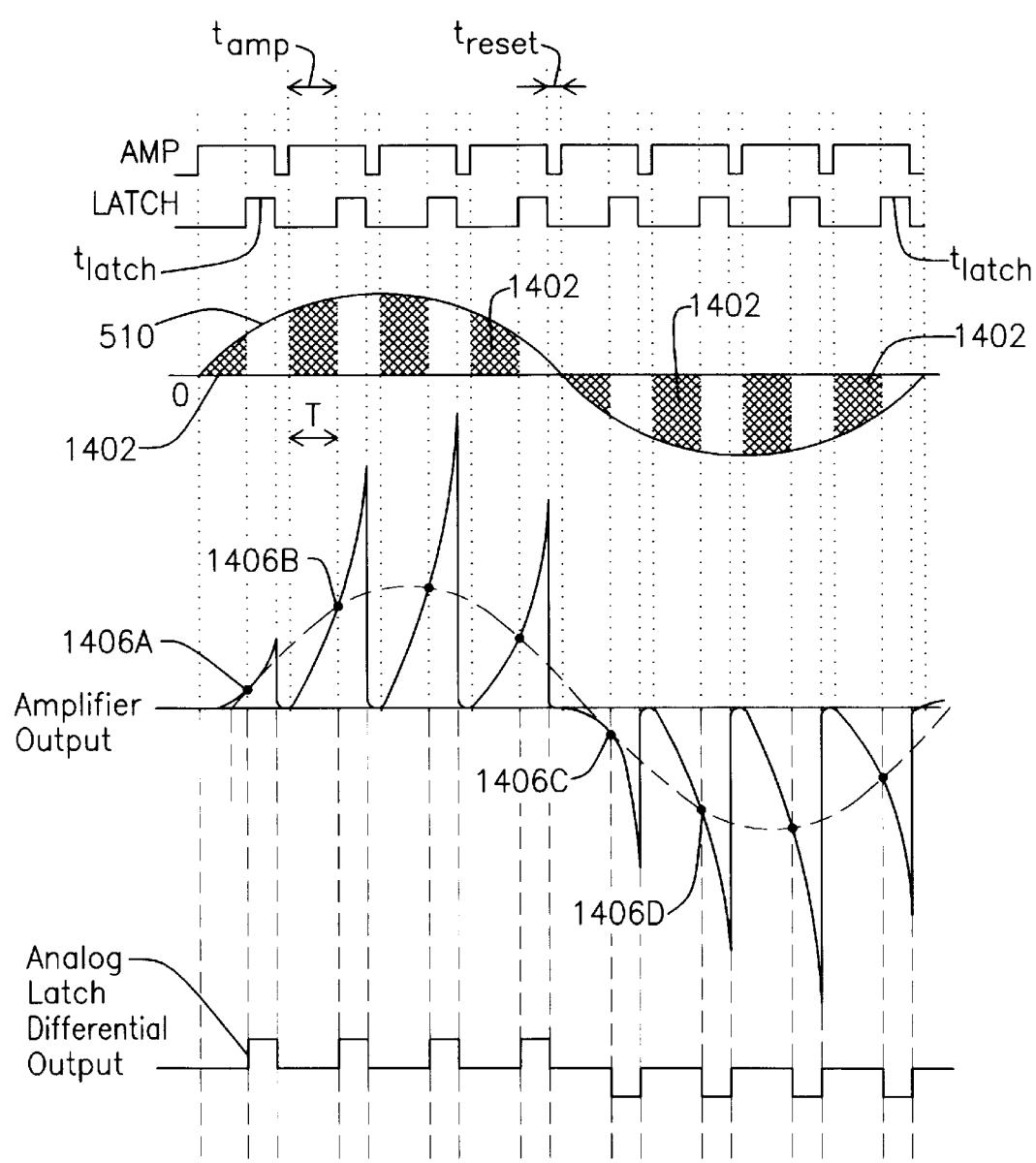

Graphically, the sliced integration may be seen in FIG. 14. As shown in FIG. 14, an example analog input voltage to the comparator voltage $V_{in}$ signal 510 is provided. The shaded areas 1402 under curve of the signal 510 indicate the area of the curve that will be integrated during the $t_{amp}$ period. The output of integrating amplifier is shown as signal 1404. The value of the output of the amplifier at the end of each $t_{amp}$ period (when LATCH goes high) is denoted as points 1406A, 1406B, 1406C, and 1406D. The value of the output 1404 at each point 1406A, 1406B, 1406C, and 1406D determines whether the analog latch will be held high or low during the $t_{latch}$ period. Thus, as shown in FIG. 14, the latch will be held high for the $t_{latch}$ periods beginning at points 1406A and 1406B and held low for the $t_{latch}$ periods beginning at points 1406C and 1406D.

The sliced integration technique described above allows the value of the capacitor 609 which provides the floating reference source to be relatively large. Further, the size of the capacitor 609 impacts the rate that the capacitor 609 will need to be refreshed as smaller capacitors will leak the stored reference value quicker. In the exemplary embodiments discussed herein, the capacitor 609 may be refreshed with the reference voltage approximately at a rate of one refresh every 1 msec while conversions may occur at a rate of one conversion every 4 nsec. Thus, thousands of conversions may occur without the need of refreshing the capacitor 609. In practice with a magnetic hard disk which operates in alternating read and servo operations, the refresh rate allows the capacitor 609 to be refreshed at the beginning of each read segment of data and each servo segment of data when the comparator calibration is performed, as discussed in more detail below. Thus in summary, the differential voltage present on a given amplifier's series capacitors 609 determines the threshold of that comparator. The initialization of this voltage takes place during an auto-zero and calibration cycle, just before conversion of actual data occurs, taking advantage of the sectored format of magnetic hard disks. During this time, the input switches 817 and 818 of FIG. 9A are switched to the resistor ladder reference voltages, driving the series capacitors to a differential reference voltage.

The clocking of the comparators thus proceeds in three phases. First, the integrating amplifier and analog latch are reset by turning on their respective reset switches. Next, the amplifier is released and allowed to integrate the differential difference between the analog input signal and threshold voltages. This integration occurs for a fixed amount of time, $t_{amp}$, which may be determined by a delay chain in a clock generation circuit. Finally, the analog latch is released and allowed to regenerate. Depending on the latch decision, either SETB or RESETB will be pulled to the negative rail, tripping the digital latch.

Figure 12:
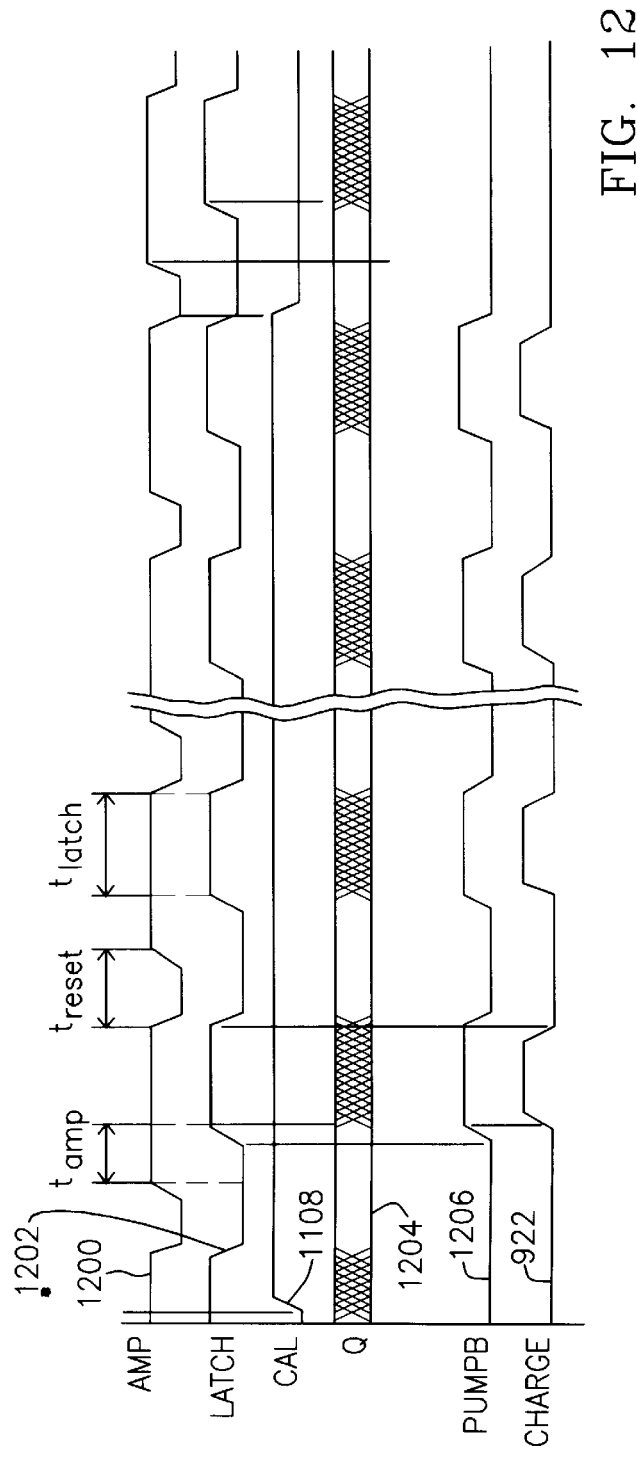

The time periods for the application of the of the AMP and LATCH signals shown in FIG. 13 may vary depending on system clock speeds and design choices. For example, the ADC may typically be clocked (clock signal 1100) at frequencies ranging from 50 to 350 MHz. The AMP signal may operate at the same speed as the clock signal. Further, as shown in FIG. 12 the $t_{reset}$ time (the time at which the AMP signal is low) may typically range from 0.5 to 1.0 nsec, the $t_{amp}$ time (the integration time between the AMP signal going high and the LATCH signal going high) may typically range from 1.0 to 1.5 nsec and the $t_{latch}$ time (the time that the LATCH signal is high) will be the remainder of the period of the system clock. As mentioned above, in an exemplary embodiment the capacitance of capacitor 950 may be approximately 30 fF and the $g_m$ of the integrating amplifier may be 212 micro-siemens which yields a time constant of approximately 141 psecs. With the amplifier integration times described herein, the gain of the amplifier may thus be approximately on the order of 7x.

The sliced integration operation provides an approximately linear operation. Linear operation is desirable in order to maintain the accuracy of the comparison and thus maintain an accurate flash ADC employing this comparator approach. It may be noted that on any given conversion cycle, typically one comparator in the array will make the critical decision which will determine the output code. Thus not all integrators (amplifiers) need operate linearly on every cycle. Linear input range of the differential pair, output headroom and integration time may thus be chosen to maintain linear operation over the input conditions of the worst-case critical comparator.

A large portion of actual flash ADC non-linearity is generated by non-idealities in the comparator implementation used in the comparator array. Predicting the total harmonic distortion of the flash ADC, composed of a plurality non-ideal comparators with quantifiable non-idealities, is desirable. The linearity analysis may involve the following considerations:

(1) A flash ADC will output a digital number which is the numerical representation of the threshold voltage (one member of the $V_1, V_2, \ldots, V_N$ reference voltages) connected to the comparator that is the closest to the point of indecision. The point of indecision for a comparator is the input voltage for which the output of the comparator is maintained in a state of unstable equilibrium. This voltage is exactly the threshold voltage in some comparator implementations but is not necessarily restricted to it.

(2) A finite quantization error flash ADC maps ranges of the continuous input voltage space into points in the digital domain.

(3) A 0 quantization error flash ADC maps every point $V_{in}$ of the continuous input voltage space into a corresponding point in the digital domain. As described in the first item, this point is the numerical representation of the threshold voltage that would keep the comparator at the point of indecision when $V_{in}$ is applied at the input.

If the mapping operation described in item 3 is a linear operation, then the flash ADC will introduce no distortion. One method to test the linearity of the mapping operation is to perform the mapping on a sine wave input set of voltages. The mapping output is a set of threshold voltages that should arrange themselves on a sine wave if and only if the mapping operation is linear. By analyzing the spectral composition of the mapping output, one could quantify how close to linear is the mapping operation. The Total Harmonic Distortion (THD) of the mapping output corresponds directly to the portion of the THD of the ADC output that is due to comparator non-idealities.

For a general comparator having the input signal $v_{in}$ connected in series with a reference threshold voltage source $V_{ref}$ that together form the input of the comparator, the comparator may characterized by the general transfer function, $f(x)$. Further, the comparator will reach the point of indecision when $f(x)=0$. In other words, in order to calculate the output of the mapping operation solve for $V_{ref}$ in the following equation:

$$f(v_{in}-V_{ref})=0$$

In order to estimate the THD of the flash ADC, $v_{in}$ may be selected to be a sine wave:

$$v_{in}=V_{in}\cos(\overline{\omega}t+\phi)$$

Further, in the particular case when the comparator is implemented using the sliced integration concept disclosed herein, the function $f(x)$ takes the following form:

$$f(x) = \frac{g_m}{C}\int_0^T x\,dt$$

Wherein T is the time $T_{amp}$ as used above with reference to FIGS. 12–14. For every phase $\phi$ of the input signal, the threshold $V_{ref}$ may be calculated which solves the following equation:

$$\frac{g_m}{C}\int_O^T [V_{in}\cos(\varpi t + \varphi) - V] = 0$$

The resulting V ($\phi$) is:

$$V(\varphi) = V_{in} \cdot \text{sinc}\left(\frac{\varpi T}{2}\right) \cdot \cos\left(\frac{\varpi T}{2} + \varphi\right)$$

The equation above shows that the sliced integration concept is a linear operation. The resulting V ($\phi$) is a sinusoidal function of $\phi$. The Fourier transform of V ($\phi$) will not show any harmonics. Note, however, that while the sliced integration technique will not introduce any non-linear (harmonic) distortion, it will introduce linear distortions. This corresponds to a frequency dependency of the magnitude and phase of the converted signal.

Substituting $f(x)$ for any non-linear voltage transfer function allows the designer to analyze the effect of a particular non-ideality on the overall ADC performance. For example, the physical implementation of the sliced integration comparator utilizes a NMOS differential pair as a transconductor. The non-linear V-I transfer function of the differential pair can be easily modeled and imbedded in the $f(x)$. The same is true for the non-constant output impedance of the differential pair with respect to the output voltage swing. Taking each non-ideality separately and quantifying its effect onto the final ADC THD allows the designer to size the transistors in the differential pair relative to the amplitude of the input sine wave and the integration time.

The sliced integration comparator technique disclosed herein provides a number of advantages over the prior art (such as shown in FIGS. 1C and 1D). First, by not utilizing a track/hold operation the reference voltage storage capacitor may be large and thus may store the reference voltage for long periods of time. Because of this storage time benefit, the sliced integration comparator may perform a long burst of comparisons between refreshes of the capacitor. This also allows for dynamic calibrations to take place at every refresh of the capacitor as described below. Further, the reference generators will rarely need to settle switching transients as opposed to once every conversion cycle in past embodiments since the sliced integration comparator stores the reference voltage and compares it against the input voltage. The sliced integration comparator also allows the input voltage to swing freely and the amplifier may integrate a moving input signal. Further, a shorter amplifier reset time is needed because the reset time need only be a sufficient time to bring the amplifier output to zero. Finally, the sliced integration comparator executes the latching operation within the same ADC clock cycle as the comparison is performed.

Calibration

In order to obtain improved performance from the ADC 320, each comparator 430 may be calibrated as disclosed herein. The methods and structures for calibrating a comparator need not be limited to calibrating the comparators of a flash ADC, but rather may be applied to any comparator in which calibration is desirable. However in a preferred embodiment, it is particularly advantageous to utilize the calibration techniques disclosed herein for calibrating a flash ADC, and more particularly, for calibrating a flash ADC utilized within a read/write channel circuit. Though the calibration techniques are described herein with reference to FIGS. 5–12 for a single comparator, the same techniques may be utilized for each comparator of the flash ADC.

Figure 5:
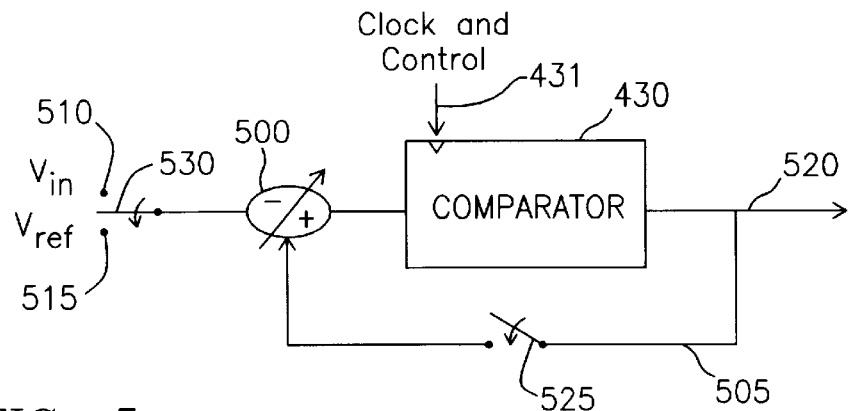
FIG. 5 is a block diagram of a circuit for implementing ADC calibration techniques according to the present invention.

As shown in FIG. 5, the comparator 430 is provided with circuitry which allows for calibration of the comparator under standard operating conditions such that both static and dynamic offsets may be calibrated. In particular, comparator 430 is provided with a feedback loop 505 which provides feedback from the comparator output 520 to an adjustable voltage input 500. Within the feedback loop 505 is provided a switch 525 which may be closed as shown by the arrow during a calibration mode while left open when analog to digital conversions are occurring. Also provided is a standard voltage input 510 (such as an analog input at which analog voltages from a disk drive may be presented). In addition to the $V_{in}$ input 510, a calibration voltage input 515 ($V_{ref}$) is also provided. The calibration voltage input 515 ($V_{ref}$) may be the ADC reference voltage such as generated from the reference voltage 400 and associated resistors 420 as shown in FIGS. 4 and 4A. An input switch 530 selects between the $V_{in}$ and $V_{ref}$ inputs depending upon whether analog to digital conversions are occurring or whether the comparator is placed within a calibration mode. During calibration, the input switch 530 is switched as shown by the arrow such that the $V_{ref}$ input is selected. Though some of the various input and outputs of the circuits shown herein are displayed as single ended signals for conceptual purposes (such as within FIG. 5), it will be recognized that full differential embodiments may be implemented for all the embodiments described.

FIG. 5 represents a block diagram of a circuit which will provide adjustability to a comparator's thresholds by using a feedback loop to adjust the thresholds. Calibration of dynamic offsets in addition to calibration of static offsets may occur by operating the comparator at standard clocking frequencies during the calibration. Thus, the ADC implements a self-calibration scheme which compensates for both static and dynamic sources of offset, internal to each comparator. Following the initial auto-zero operation, each comparator is clocked as it will be during actual conversion, but with its input still connected to the reference voltage ladder. Ideally, after auto-zero the comparator would be exactly at its threshold, and its output would thus be undetermined; however, due to as-yet-uncompensated static and dynamic offsets, the comparator may still have either a high or low output. The calibration scheme utilizes these mismatch-induced decisions to adjust the differential voltage stored on the amplifier's series coupling capacitors, essentially forming a negative feedback control loop such that the comparator's threshold is adjusted increasingly close to its ideal reference value.

FIG. 6 illustrates a more detailed circuit block diagram for implementing the principles shown in FIG. 5. As shown in FIG. 6, inputs 510 and 515 are selectively connected to the comparator through the input switch 530 as discussed above for calibration operation or ADC operation. The switch 530 is connected to a buffer amplifier 605 which has an output connected to two capacitors 607 and 609. The capacitor 609 is also connected to a voltage node 610 ($V_a$). Thus, the comparator input is AC coupled to a voltage node 610 ($V_a$). The capacitor 607 has a capacitance value of C while the capacitor 609 has a capacitance value seven times the value of C (7C). The buffer amplifier 605 serves to isolate the ADC comparators 430 from each other so that loading effects between comparators and other interactions while performing the calibration are minimized.

The voltage node 610 is provided as an input to an integrating amplifier 615. Though the calibration techniques disclosed herein are discussed with reference to an integrating amplifier, it will be recognized that the calibration techniques may be utilized with many types of amplifiers. Switch 620 operates as a reset switch and is closed as shown by the arrow during the auto-zero sequence. The switch 620 is reopened when the auto-zero operation is completed. The output of integrating amplifier 615 is provided to an analog latch 625 which provides an output to a digital latch 630. The output of the digital latch 630 is provided through NAND gates 634 to a second digital latch 635. The calibration signal CALB 632 (as utilized herein, inverted signals are indicated by the notation "B") is also provided as inputs to the NAND gates 634. The outputs of the second digital latch 635 provide the outputs 520 of the entire comparator structure. These outputs 520 may then be provided to encoding logic such as shown in FIG. 4.

The outputs of the first digital latch 630 and the second digital latch 635 are also provided to up/down logic 645. The up/down logic 645 provides a signal which controls a switch 650. In response to the up/down logic 645, switch 650 selectively connects a $V_{down}$ voltage 655 or a $V_{up}$ voltage 660 to one side of the capacitor 607. A pump switch 665 is also provided for use during the calibration operation. When closed, the pump switch 665 connects the capacitor 607 to the voltage node 610 ($V_a$). The pump switch 665 is normally closed during standard ADC operation, however, as discussed in more detail below, the pump switch 665 is toggled open during certain periods of the calibration procedure.

The calibration techniques disclosed herein may be viewed as a two-step calibration. First an auto-zero step is performed and then a second dynamic calibration step is performed. When one desires to calibrate the ADC, the input switch 530 is connected to the $V_{ref}$ input 515 to provide a reference voltage to the system. Switch 620 is then closed. Operation of the input switch 530 and switch 620 in this manner performs an auto-zero operation which may account for static offsets by setting the node $V_a$ to the bias voltage of the integrating amplifier 615. Thus, when the switches are closed as described, the amplifier and latches may be biased to account for the static offset. After the auto-zero step is performed, the switch 620 is then opened again.

In addition to an auto-zero step for static offsets, the calibration technique for the circuit of FIG. 6 also allows for calibration of dynamic offsets by performing a second calibration step. The dynamic offsets may be compensated for during the second calibration step because the comparator is run (i.e. clocked) at standard operation speeds with the input switch 530 still set to connect to the circuit to the $V_{ref}$ input voltage 515. This sets the digital output 520 to a high or low value depending on the value of the dynamic offset of the comparator.

After the dynamic offset has set the digital outputs to a high or low value, the calibration continues by application of the calibration signal 632 (CALB) to the gates 634 to hold the second digital latch in either the high or low value. The CALB remains low during the remaining sequences of the calibration procedures until it is determined that calibration has been completed. Thus, the second digital latch remembers which voltage direction the input voltage to the integrating amplifier 615 ($V_a$) should be adjusted in order to compensate for the dynamic offsets. After the calibration signal 632 (CALB) goes low, voltage at node $V_a$ is repeatedly adjusted in small increments by adding or removing a small amount of charge stored on the capacitor 607 (C) until the comparator reaches its actual desired threshold, at which point calibration is halted.

The voltage adjustment is performed by repeatedly implementing a series of adjustment steps. These adjustment steps first include clocking the comparator, then comparing the outputs of the first digital latch 630 and the second digital latch 635 through use of the up/down logic 645. If the comparison of the outputs of the first digital latch 630 and the second digital latch 635 indicates that the outputs of each latch are the same, then the up down logic 640 generates a signal 646 which indicates that a voltage adjustment, either upward or downward, is necessary. When a voltage adjustment is necessary, the pump switch 665 is opened to disconnect the capacitor 609 and 607. The switch 650, is set to connect either the $V_{up}$ node 660 or the $V_{down}$ node 655 to the capacitor 607 momentarily (charging capacitor 607 up or down slightly) depending upon whether the $V_a$ voltage node 610 needs to be moved up or down respectively. Then, the switch 650 is disconnected from the $V_{up}$ or $V_{down}$ nodes. Finally, the pump switch 665 is closed, thus sharing the charge between capacitor 607 and capacitor 609 and moving the $V_a$ voltage node 610 up or down slightly. Because the capacitance of capacitor 607 is only one-eighth the combined capacitance of capacitors 607 and 609, the amount of incremental voltage change may be very small compared to the LSB voltage of the ADC. It will be recognized, however, that the chosen capacitance values and ADC bit accuracy may vary depending upon a designer's specific specifications and requirements, particularly with regard to total calibration range versus the resolution of the calibration.

The adjustment procedure is repeatedly performed, moving the $V_a$ voltage node 610 incrementally in the same direction until the digital latch 630 and the digital latch 635 have different outputs. The first detection of different output values on the digital latches indicates that between two adjustment cycles the comparator output has changed (from high to low or vice-versa) which thus indicates that the comparator has reached its actual threshold voltage and calibration should be halted. Normal ADC operations may then proceed with the comparators now calibrated. Each comparator 430 of a flash ADC circuit such as shown in FIG. 4 may be calibrated simultaneously in this manner. Thus, the calibration signal Calb 632 may be provided to each comparator of the ADC circuit. The calibration time is chosen to be long enough such that calibration of each comparator will have been completed in the allotted time frame. During ADC operation, the calibration process described may occur repeatedly to maintain system accuracy. Thus, for example, calibration may occur at the beginning of each servo data read operation and each disk data read operation (i.e., twice each disk sector). Example calibration frequencies may be between 1 kHz and 20 kHz.

Figure 7:
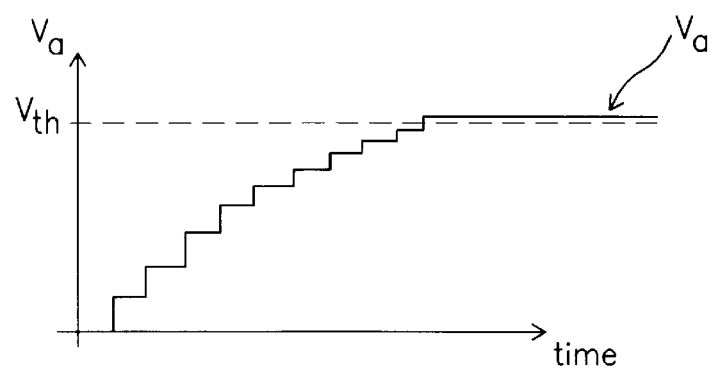
FIG. 7 is a graph of a voltage node of the circuit diagram of FIG. 6 during calibration.

As described above, each comparator may be cycled through a series of one or more incremental voltage adjustments to compensate for the dynamic offsets until the actual threshold $V_{th}$ is reached. FIG. 7 illustrates a demonstrative representation of the voltage at the voltage node 610 ($V_a$) versus time during the calibration. As can be seen from FIG. 7, the adjustment voltage $V_a$ is incrementally adjusted until $V_a$ first exceeds $V_{th}$ where $V_{th}$ is the actual threshold of the comparator due to dynamic and static offsets. As seen in FIG. 7, the $V_a$ voltage steps decrease with each step for improved accuracy. The decay in the voltage steps occurs due to the RC nature of the switched capacitor circuit utilized. The values of $V_{up}$ and $V_{down}$ may be chosen such that the difference between $V_{up}$ and $V_{down}$ is six LSBs (approximately 96 mV). The generation of $V_{up}$ and $V_{down}$ is discussed in more detail below. Generally, the switch 650 is closed sufficiently long to fully charge capacitor 607. Typically, switch 650 may be closed for approximately 1 nsec. In one six bit ADC embodiment, the first step may be one-fourth an LSB or approximately 4 mV. In this case the worst case error between two comparators would be one-half an LSB (one-fourth an LSB for each comparator).

Figure 7A:
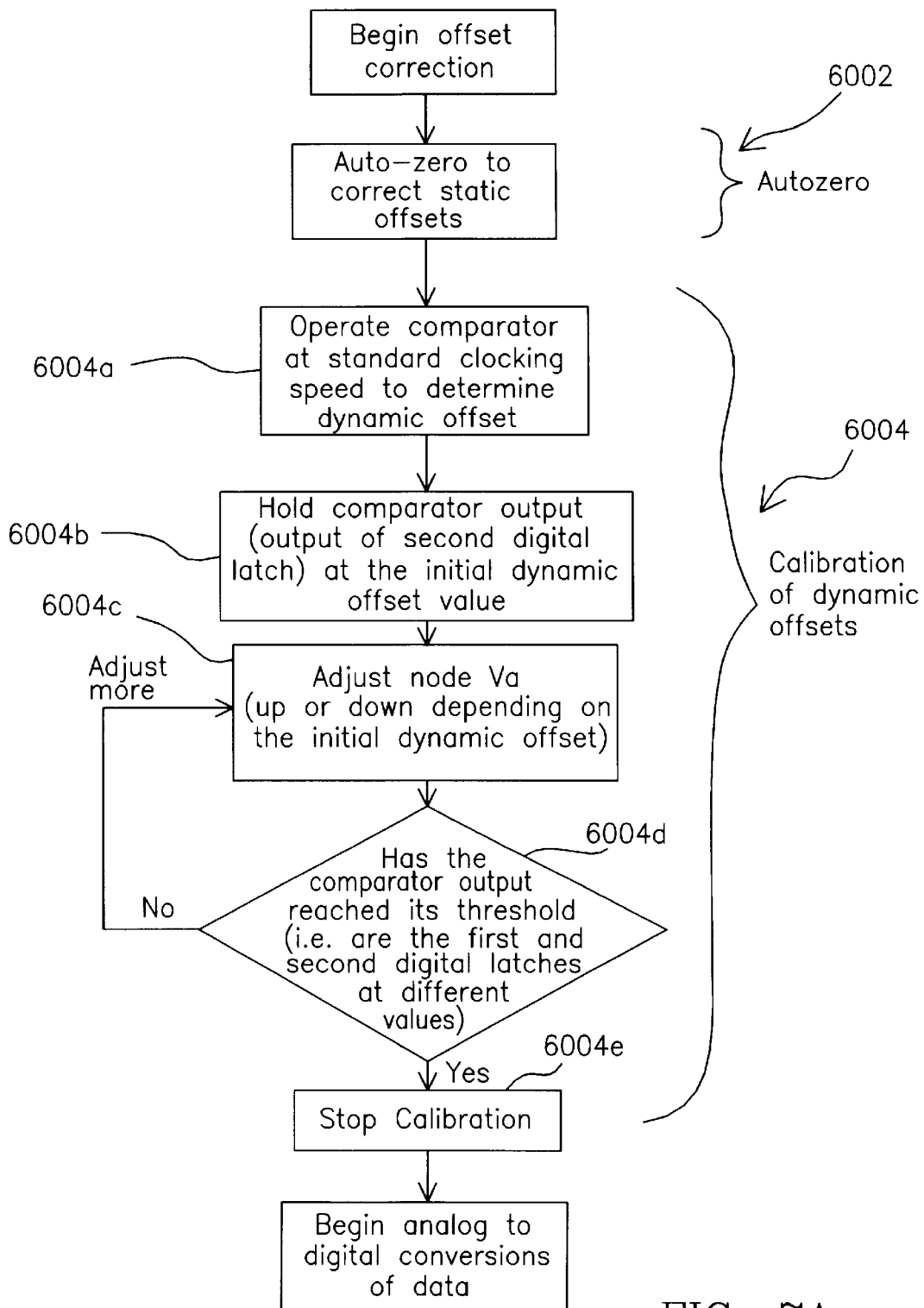
FIG. 7A is a flowchart of one embodiment of the calibration procedure disclosed herein.

A summary of one embodiment of the calibration steps described above may be seen in the flow chart of FIG. 7A. As shown in the flow chart of FIG. 7A, the offset correction process disclosed herein includes an auto-zero step 6002 to correct for static offsets and a calibration of dynamic offsets procedure 6004 which calibrates the dynamic offsets. The calibration of dynamic offsets procedure 6004 includes the sub-steps 6004a–e. As shown in the figure, after the auto-zero step 6002 the comparator is then operated at standard clocking speeds to determine the dynamic offsets within step 6004a. Next, step 6004b is performed to hold the comparator output (the output of the second digital latch 635) at the initial dynamic offset value. Next, step 6004c is performed to adjust the voltage at node $V_a$ up or down depending upon the initial dynamic offset. Next, the comparator output is checked to determine whether it has reached its threshold (i.e., when the first and second digital latches have different values at their outputs). If the comparator has not reached its threshold, the voltage adjustment node step 6004c is repeated. When it is determined in step 6004d that the comparator output has reached its threshold, the calibration is stopped in step 6004e. After the calibration has been stopped, the comparator has been fully calibrated and is ready to begin performing analog to digital conversions of data.

Figure 8:
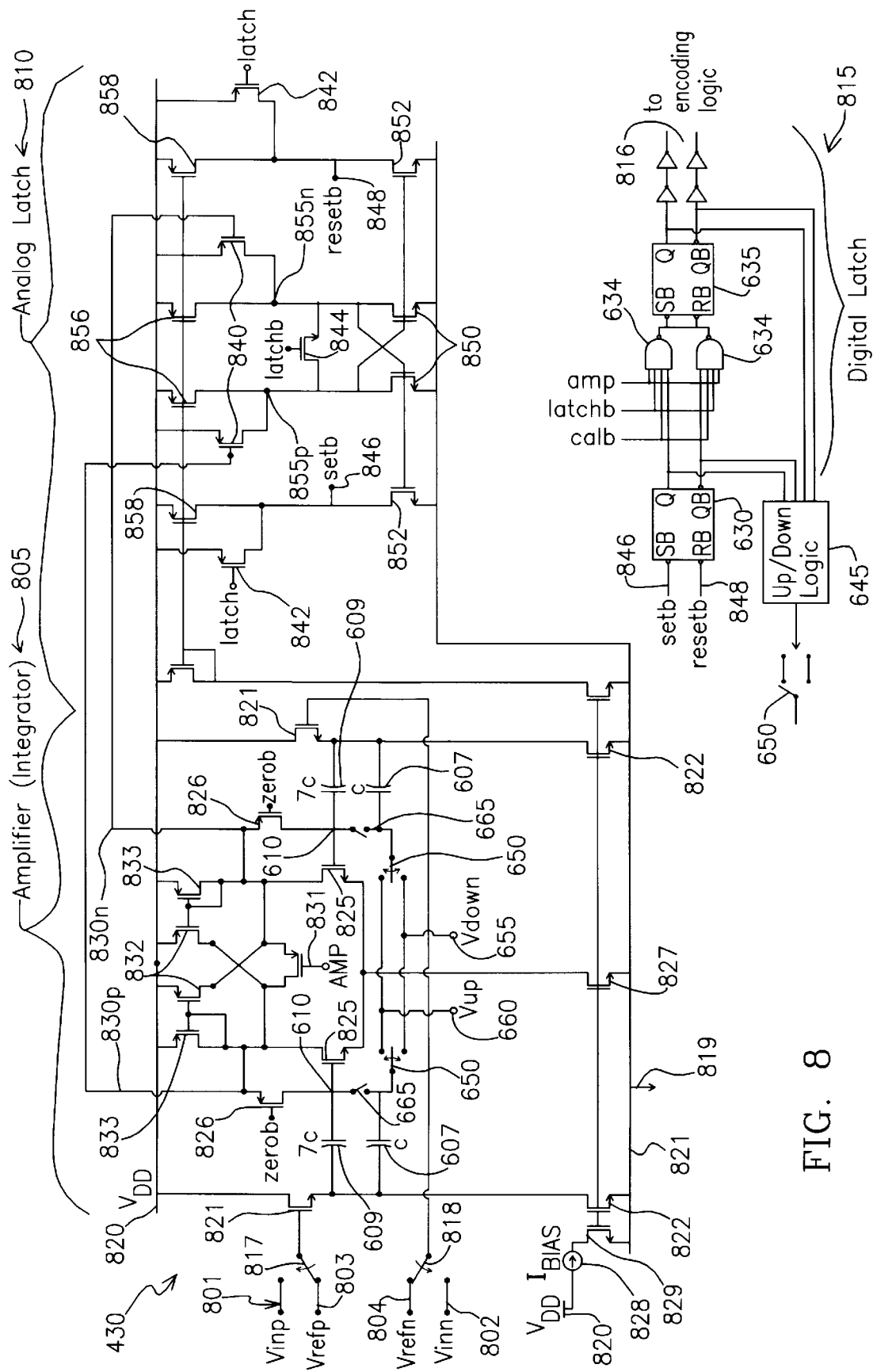
FIG. 8 is an exemplary circuit for accomplishing the ADC calibration techniques according to the present invention.

The calibration techniques shown herein may be utilized with a variety of comparator circuits and designs and the techniques need not be limited to a specific design. One preferred embodiment for use as the comparator 430 is shown in FIG. 8. As shown in FIG. 8, the comparator 430 may include three circuit blocks, such as an integrating amplifier 805, an analog latch 810, and a digital latch 815. The inputs to the comparator 430 may be differential inputs, such as analog voltage inputs $V_{inp}$ 801 and $V_{inn}$ 802 and the calibration voltage input $V_{refp}$ 803 and $V_{refn}$ 804. Input switches 817 and 818 are provided for selecting which of the inputs are connected to the comparator 430. The comparator also has an output 816 which may be provided to digital encoding logic, such as digital logic 490 of FIG. 4.

The signals at the inputs of the comparator 430 are first provided to the integrating amplifier 805. The integrating amplifier or 805 is of symmetrical design for the side of the integrating amplifier with like reference numbers utilized FIG. 8 for each symmetrical circuit element. The inputs to the integrating amplifier 805 are first provided to a pair of differential input transistors 821. The input transistors 821 are connected between $V_{DD}$ 820 and transistors 822. Transistors 822 are also connected to ground 819. The input transistors 821 are also connected capacitors 609 and 607 which have capacitance values of 7C and C respectively as shown in FIG. 8 and also described with respect to FIG. 6. In one preferred embodiment, the value of 8C may be 0.300 pF. Also connected to the capacitors 609 and 607 are a pump switches 665 and switches 650. As described above again with respect to FIG. 6, pump switch 665 is selectively opened or closed to isolate and connect capacitors 609 and 607 and switch 650 is selectively applied to the voltage up input 660 or the voltage down input 655 as needed during calibration. The capacitors 609 are also connected to voltage nodes 610 ($V_a$), which again operates similar to voltage node 610 of FIG. 6. The voltage nodes 610 are also connected to the gates of differential transistors 825. One side of each differential transistors 825 is coupled together and to transistor 827. The other side of each transistor 825 provides the output of the integrating amplifier 805 via output lines 830P and 830N which are provided to the analog latch circuitry 810.

Connected between the gate of each transistor 825 and the outputs 830 is a transistor 826. Transistor 826 operates to perform the function of the switch 620 of FIG. 6. The input to each transistor 826 is the ZEROB signal which indicates when the auto-zero step of the calibration sequence is to be performed.

The outputs 830P and 830N are also coupled together through transistor 831 which is controlled by a gate signal AMP. When the AMP signal goes low, the integrating amplifier 805 is reset. The source and drain of transistor 831 are each also connected to one of a pair of transistors 832 which are controlled by gate signals which are connected to transistors 833 as shown. The integrating amplifier 805 also includes a bias current source 828 which is connected to a transistor 829. The gates of transistors 829, 822, and 827 are all tied together as shown.

The outputs 830P and 830N of the integrating amplifier 805 are provided to a pair of analog latch input transistors 840. The input transistors 840 are connected between $V_{DD}$ 820 and nodes 855P or 855N as shown. The nodes 855P and 855N are coupled to $V_{DD}$ through transistors 856 and coupled to ground through cross-coupled transistors 850. The gates of transistors 850 are also connected to the gates of transistors 852 as shown while the gates of transistors 856 are also coupled to the gates of transistors 858 as also shown. The analog latch 810 operates in response to a LATCH signal and LATCHB signal. The LATCH signal is provided to transistors 842 while the LATCHB signal is provided to transistor 844. The outputs of the analog latch 810 are provided at output nodes 846 (the SETB signal) and output node 848 (the RESETB signal). The transistor 844 operates as a switch in response to the LATCHB signal such that when the LATCHB signal goes low the connection between nodes 855P and 855N through the transistor 844 is opened and either the SETB or RESETB signal is pulled down hard. This effectively converts the analog voltage level of the amplifier and the analog latch to digital levels compatible with the digital latch.

The SETB and RESETB outputs of the analog latch are provided to the digital latch circuitry 815. The digital latch circuitry 815 may include digital latches 630 and 635, such as SR flops as shown. The outputs of the latch 630 are provided to the NAND gates 634. The NAND gates 634 also receive as inputs the AMP signal, the LATCHB signal and the CALB signal. The outputs of the NAND gates 634 are provided as inputs to the latch 635. The outputs of the latches 630 and 635 are provided to the up/down logic 645 for determining a control signal for operating the switches 650 as described above with reference to FIG. 6. The outputs of the latch 635 are also provided through inverters to provide the outputs 816 of the comparator 430.

An alternative preferred embodiment for implementing the present invention is shown in FIG. 9. The circuit of FIG. 9 is similar to that of the circuit of FIG. 6; however, the circuit of FIG. 9 is drawn as a differential circuit, and more importantly, includes alternate embodiments for implementing the application of the $V_{up}$ and $V_{down}$ voltages and the up/down logic 645 of FIG. 6. As shown in FIG. 9, the $V_{up}$ and $V_{down}$ voltages connected through the use of switches 650 may be voltages which are supplied through a voltage stored across a capacitor. More particularly, as shown in FIG. 9, one switch 650 is connected to node 940 when a $V_{down}$ voltage is desired for that side of the amplifier and the other switch 650 is connected to node 942 to provide a $V_{up}$ voltage to the other side of the amplifier (or vice-versa). During calibration the voltage on node 940 is generated from a voltage stored across capacitor 904. In one embodiment the capacitance of capacitors 904 and 902 may be 2C (75 fF). The voltage stored on capacitor 904 is generated by closing switch 908 to connect voltage source 910 to the capacitor 904. Switch 908 is closed prior to the dynamic calibration steps and opened before the dynamic calibration begins. Likewise, the $V_{up}$ portion of the circuitry operates in a similar fashion by connecting a switch 650 to node 942 to receive charge stored on capacitor 902. Switch 906, as with switch 908, is closed prior to the dynamic calibration sequence and opened during calibration. Because the voltage source used for $V_{up}$ or $V_{down}$ is now a charged capacitor, the amount of charge incrementally applied to the capacitors 607 (and thus the amount of voltage adjustment at voltage nodes 610 ($V_a$)) is smaller for each repetition of the voltage adjustment. Voltage sources 910 ($V_{down}$) and 912 ($V_{up}$) may be each set at 3 LSBs (approximately 48 mV) offset from a voltage source 911. Voltage source 911 is set to provide a voltage $V_{abias}$ which is a voltage that matches the voltage at node 610 ($V_a$) immediately after the auto-zero step is performed.

In addition to the use of the modified $V_{up}$ and $V_{down}$ circuitry as shown in FIG. 9, the circuit of FIG. 9 differs from the circuit of FIG. 6 in that the up/down logic 640 of FIG. 6 has been modified. As shown in FIG. 9, the outputs of the first digital latch 630 are provided to a pair of gates 920. The gates 920 also receive a charge signal 922 which is indicative of time periods in which it is desired to connect switches 650 to either node 940 or node 942 in order to transfer or remove charge to and from capacitors 607. At the onset of dynamic calibration, the outputs of the first digital latch 630 indicate whether the voltage at node 610 ($V_a$) needs to be adjusted upward or downward. The combination of the outputs of first digital latch 630 and the charge signal as shown provides the upb signal 926 and the downb signal 928 as shown. The signals 926 and 928 in turn control switches 650.

FIG. 9A illustrates the $V_{up}$ and $V_{down}$ logic of FIG. 9 and the modified offset detection circuitry of FIG. 9 except the circuit of FIG. 9A illustrates a full transistor schematic. Moreover FIG. 9A illustrates the implementation of the circuits of FIG. 9 within a comparator 430 with like reference numbers and circuitry as shown and described above with reference to FIG. 8. Thus, the $V_{up}$ and $V_{down}$ logic of FIG. 9A may replace the $V_{up}$ node 660 and $V_{down}$ node 655 of the differential comparator circuitry as shown in FIG. 8 and the up/down logic 645 of FIG. 8 is replaced by the gates 920 of FIG. 9A.

As shown in FIG. 9A, each storage capacitor 904 and 902 is connected to each switch 650. In operation, switches 650 are controlled by the control signals 926 and 928 as shown in FIG. 9. At any given time that the switches 650 are connected to the up or down nodes, one switch 650 will be connected to the up node (node 942) while the other switch would be connected to the down node (node 940). Thus, during calibration the charge on each of the capacitors 940 and 942 will be gradually changing each time the switches 650 are connected to nodes 942 or 940.

Figure 9B:
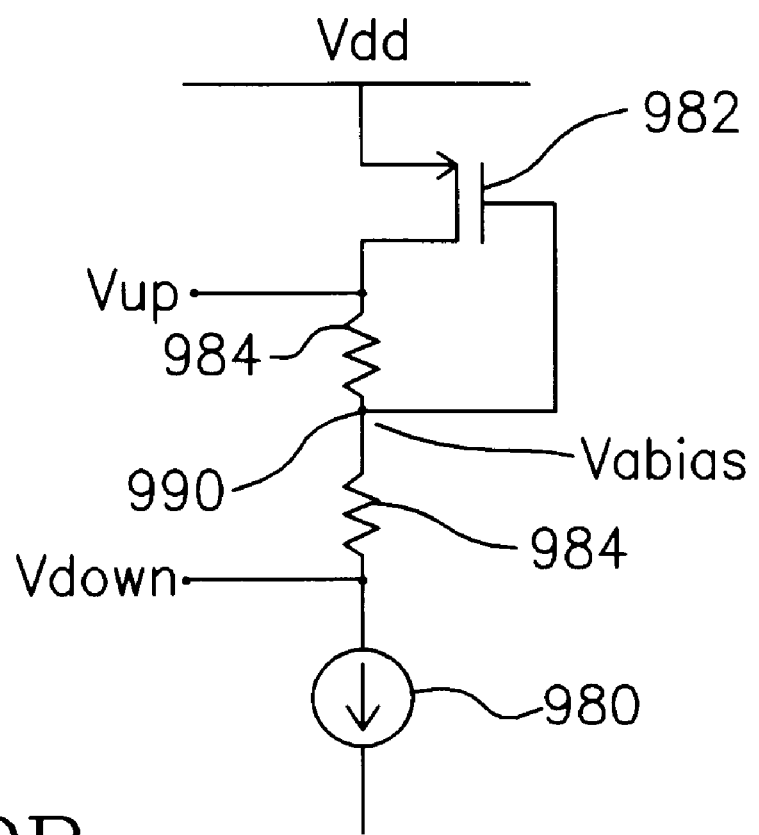
FIG. 9B illustrates a circuit for generating the $V_{up}$ and $V_{down}$ voltages.

FIG. 9B shows one example circuit for generating the $V_{up}$ and $V_{down}$ voltages. As shown in FIG. 9B, the voltage at node 990 ($V_{abias}$) is intended to replicate the voltage at node 610 ($V_a$) immediately after the auto-zero step is performed. This is accomplished by providing a current source 980 which replicates the current through transistor 827 of FIG. 9A when the auto-zero operation is completed and by providing a transistor 982 which replicates transistors 833 of FIG. 9A. Two resistors 984 are provided to generate the desired voltage difference between $V_{up}$ and node 990 and between $V_{down}$ and node 990.

Figure 10:
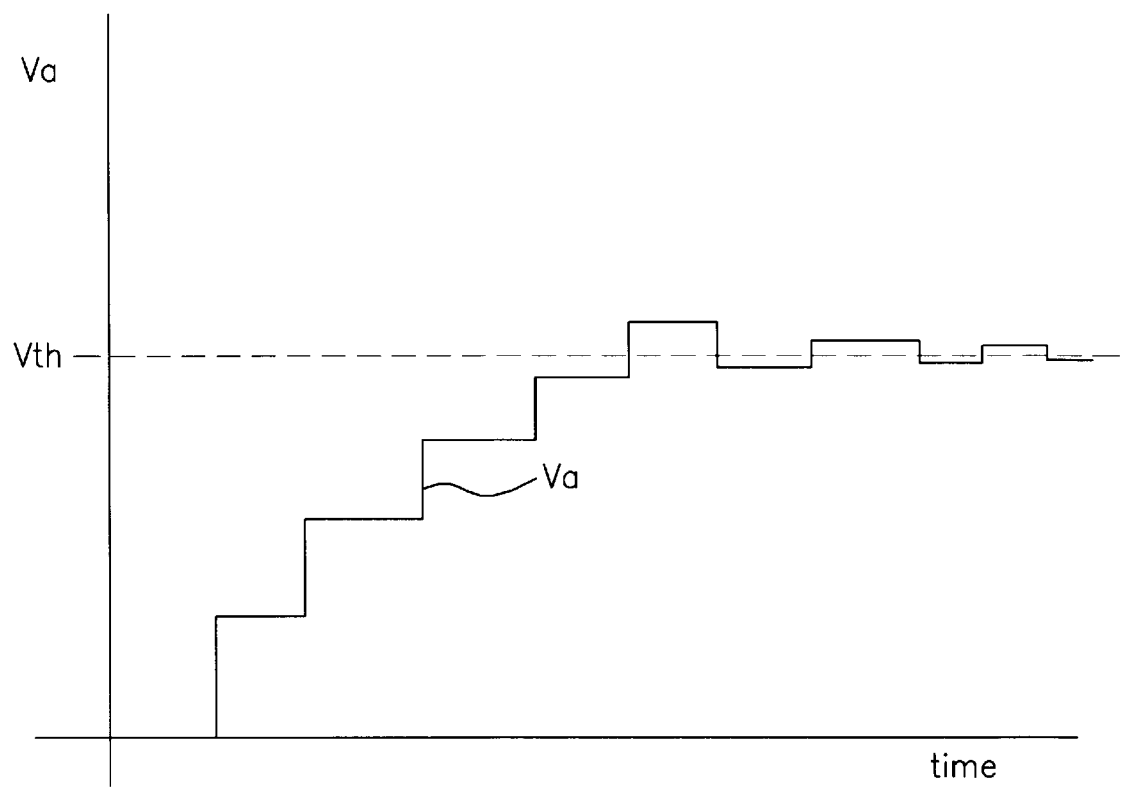
FIG. 10 is a graph of a voltage node of the circuit diagram of FIG. 9 during calibration.

In operation, the circuits of FIGS. 9 and 9A allow for simpler control circuitry than that of the circuits of FIGS. 6 and 8. In particular, within the circuit of FIG. 8, the voltage adjustments at node $V_a$ are continued until it is determined (within the up/down logic 645) that the output of the comparator had crossed the $V_{TH}$ level. However during calibration of the circuit of FIG. 9A, voltage adjustments are not ceased when the output voltage crosses the desired threshold voltage $V_{TH}$, but rather adjustments are continually made at predetermined time intervals or for a predetermined number of adjustments. Because the charge transferred from the capacitors 904 or 902 during each voltage adjustment is incrementally lessened during each voltage adjustment step, the voltage at node Va will continually change by smaller amounts. An example of this may be seen in FIG. 10. As shown in FIG. 10, the voltage at node $V_a$ changes by ever decreasing amounts. However, unlike the approach as shown in FIG. 7, when the voltage at node $V_a$ crosses the $V_{TH}$ point, the calibration does not stop, but rather continues. As shown in FIG. 10, after the voltage at node $V_a$ crosses the $V_{TH}$ value the voltage adjustments continue, however successive voltage adjustments may be of an opposite polarity with the voltage at node $V_a$ approaching the $V_{TH}$ value closer and closer with each adjustment. Because the magnitude of charge on each capacitor 904 and 902 is dropping with each voltage adjustment, when polarity changes of the voltage adjustment occur, the next voltage adjustment will still be less in magnitude than the previous adjustment.

Thus, during operation the embodiment of FIGS. 9, 9A, and 10 is performed for a predetermined interval rather than performed until a crossing of the $V_{TH}$ level is detected. In one embodiment the calibration may be set to operate for 10 voltage adjustment increments. The 10 calibration cycles may typically be clocked at frequencies between 50 MHz and 350 MHz.

Thus, a comparator is provided with a threshold-adjusting switch network provided as a control loop around the amplifier. The control loop includes logic which detects whether an up or down threshold adjustment is necessary. The result of the comparator's previous threshold decision is used to determine which direction to move the threshold. Prior to calibration, capacitors 902 and 904 are charged to reference voltages $V_{up}$ and $V_{down}$. This establishes a finite amount of charge in the calibration system. Capacitors 607 are for the purpose of transferring small amounts of this charge to the larger coupling capacitors 609. To move the threshold up, for example, capacitors 609 are disconnected from capacitors 607. Then capacitors 607 are connected to capacitors 902 and 904. Finally, capacitors 607 are 34, disconnected from capacitors 902 and 904 and re-connected to capacitors 609. It is advantageous to have capacitors 902 and 904 present instead of simply voltage sources because during the self-calibration process a comparator can "overstep" its threshold. Thus, on the next calibration cycle, the connection polarity of the transfer capacitors to the reference capacitors results in a step in the opposite direction. By employing capacitors to supply the reference levels, their charge will be somewhat depleted by the time a step reversal occurs. On the other hand, the reverse step that would occur with fixed voltage sources may be large and may compromise the final accuracy of the threshold.

Figure 10A:
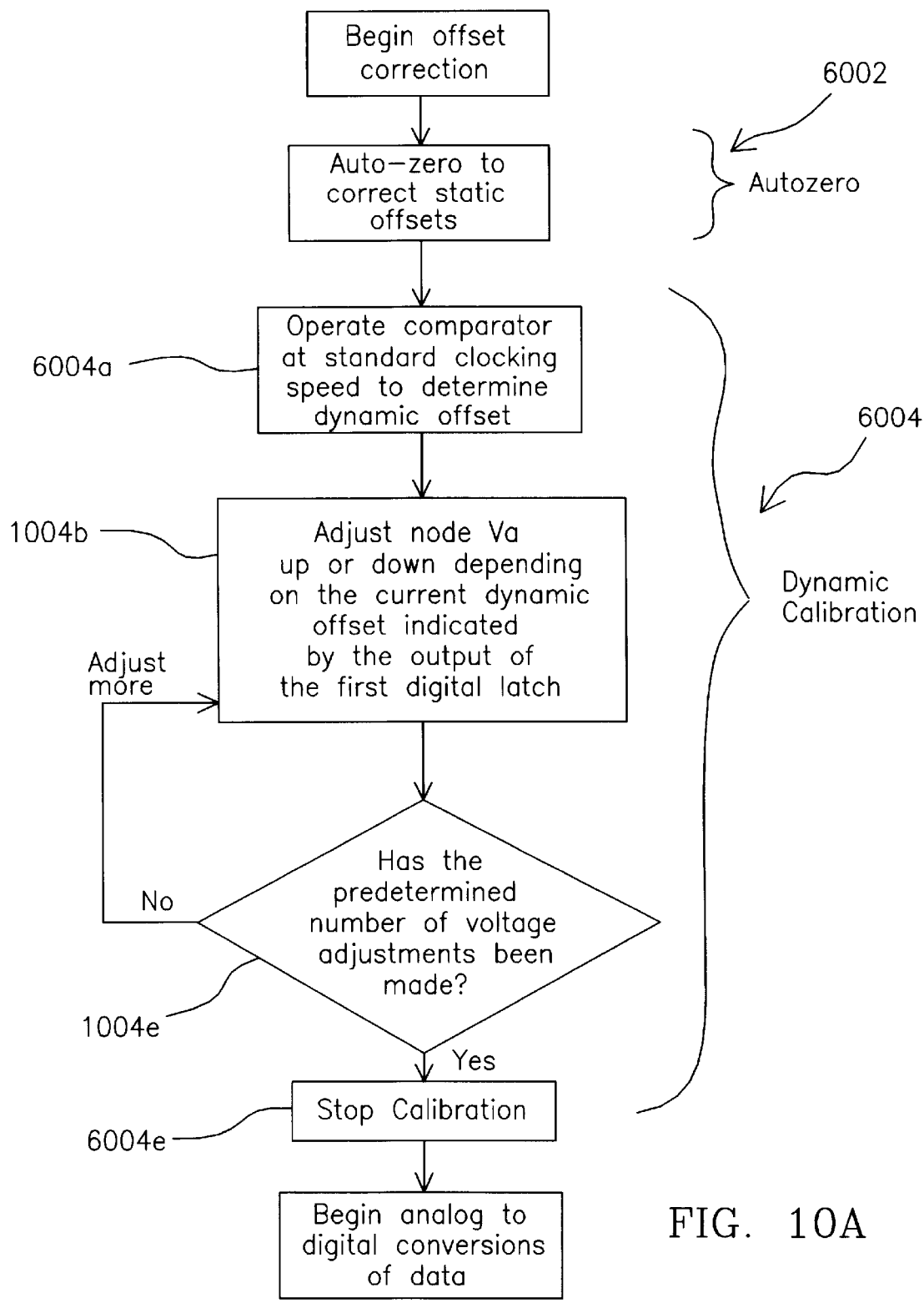
FIG. 10A is a flowchart of the calibration procedure disclosed herein within reference to the embodiment of FIGS. 9, 9A and 10.

A flow chart summarizing the steps of implementing the embodiments shown in FIGS. 9, 9A, and 10 is shown in FIG. 10A. The flow chart of FIG. 10A is similar to the flowchart of FIG. 7A except the dynamic calibration steps 6004*b*–*d* of FIG. 7A have been replaced with steps 1004*b* and 1004*c*. As shown in FIG. 10A, after the initial dynamic offset is determined in step 6004*a*, the voltage at node $V_a$ is adjusted depending upon what the current offset is as indicated by the output of the first digital latch 630. Then within step 1004*c* it is determined whether the predetermined number of voltage adjustments (or a predetermined time) has occurred. If not, control passes back to step 1004*b* for additional voltage adjustments. When the predetermined number of adjustments has occurred, the calibration procedure is halted as indicated by step 6004*e*.

Figure 11:
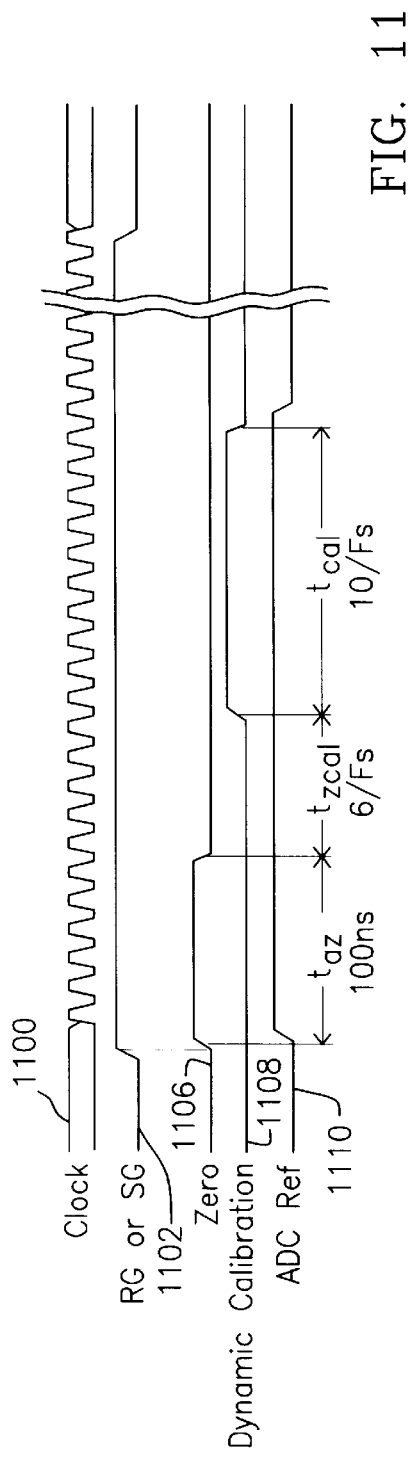
FIGS. 11 and 12 are timing diagrams of the calibration procedure disclosed herein within reference to the embodiment of FIGS. 9, 9A and 10.

Timing diagrams for implementing the circuits of FIGS. 9, 9A, and 10 are shown in FIGS. 11 and 12. FIG. 11 illustrates the relationship between the clock signal 1100, a read or servo begin signal 1102, the ZERO signal 1106, the dynamic calibration signal (CAL) 1108, and the ADC REF signal 1110. As shown in FIG. 11, after a read or servo signal 1102 is received to indicate the start of a read or servo operation, an auto-zero procedure is commenced as indicated by the high application of the ZERO signal 1106 (the inverse of the ZERO signal, ZEROB, controls transistors 826 of FIG. 8). In addition, the ADC REF signal 1110 controls the input switches (switch 530 or switches 817 and 818) so that the reference voltages (for example $V_{ref}$ of FIGS. 6, 8, 9 and 9A) are coupled to the integrating amplifier through the input switches when the ADC REF signal 1110 is taken high. In the illustrative embodiment of FIG. 11, the auto-zero step may last for 100 ns. The dynamic calibration signal (CAL) 1108 indicates the period during which calibration may occur. As shown in FIG. 11, an illustrative example time for calibration time is 10/$F_s$ (10 clock cycles). Between the period in which the auto-zero is accomplished and the dynamic calibration is accomplished, a time period ($t_{zcal}$) is provided so that the comparators may settle after the auto-zero step.

The operations which occur during the $t_{cal}$ period are shown with more detail in FIG. 12. In particular, FIG. 12 shows operations while the dynamic calibration signal 1108 is high. The AMP signal 1200, the LATCH signal 1202, the data signal (Q) 1204, the PUMPB signal 1206, and the CHARGE signal 922 are all shown. The AMP signal 1200 controls the transistor 831 and the LATCH signal 1202 (and its inverse LATCHB) control transistors 842 and 844 respectively as shown in FIG. 8. The data signal 1204 represents the outputs of the first digital latch 630 which may be provided to the gates 920 as shown in FIG. 9. The CHARGE signal 922 is the other input to the gates 920 as shown in FIG. 9. The PUMPB signal 1206 controls the operation of the pump switches 655 such that when PUMPB signal is low the pump switches 655 are closed and when the PUMPB signal is high the pump switches 655 are opened. After, the PUMPB signal goes high, charging of the capacitors 607 may occur and thus the CHARGE signal is taken high. After the CHARGE signal falls (and thus the switches 650 are no longer connected to the up or down nodes 940 and 942), the PUMPB signal falls causing the pump switches 655 to close, and thus change the voltage level at the voltage nodes ($V_a$) 610. In one illustrative embodiment, the dynamic calibration may include 10 incremental adjustments of the voltage $V_a$ which would correspond to 10 toggles of the PUMPB signal 1206 and the CHARGE signal 1208 while the CAL signal 1108 is high.

The time periods for the application of the of the AMP, LATCH, PUMPB, and CHARGE signals shown in FIG. 12 may vary depending on system clock speeds and design choices. For example, the ADC may typically be clocked (clock signal 1100 of FIG. 11) at frequencies ranging from 50 to 350 MHz. The AMP signal may operate at the same speed as the clock signal. Further, as shown in FIG. 12 the $t_{reset}$ time (the time at which the AMP signal is low) may typically range from 0.5 to 1.0 nsec, the $t_{amp}$ time (the integration time between the AMP signal going high and the LATCH signal going high) may typically range from 1.0 to 1.5 nsec and the $t_{latch}$ time (the time that the LATCH signal is high) will be the remainder of the period of the system clock. The PUMPB signal may be high for the same time as the LATCH signal. The CHARGE signal may go high approximately 0.25 nsec after the PUMPB signal goes high and the CHARGE signal may fall approximately 0.25 nsec before the PUMPB signal so pumping and charging do not occur at the same time.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as illustrative embodiments. Various changes may be made in the configuration, arrangement, and types of components or devices. For example, equivalent elements or circuit blocks may be substituted for those illustrated and described herein, and certain features of the invention may be utilized independently of the use of other features, all as would be apparent to one skilled in the art after having the benefit of this description of the invention.

What is claimed is:

1. A method of calibrating a plurality of comparators of an ADC circuit, comprising:
   providing an ADC circuit having a plurality of comparator circuits;
   operating the comparators; and
   calibrating each comparator individually by correcting dynamic offsets while the comparator is operating.

2. The method of claim 1, further comprising:
   performing an auto-zero operation to correct static offsets prior to the calibrating step.

3. The method of claim 2 wherein the ADC circuit is a flash ADC circuit.

4. The method of claim 1, further comprising:
   compensating for offsets by performing an auto-zero operation;
   operating the comparators at operating clock speeds to determine a dynamic offset of each comparator;
   adjusting by an incremental amount an electrical signal at least one node of each comparator circuit to lessen the dynamic offset; and
   repeating the adjusting step until the dynamic offset is sufficiently corrected or until the adjusting step has been repeated a predetermined number times or repeated for a predetermined length of time.

5. The method of claim 4 wherein the electrical signal is a voltage coupled to an input of an amplifier of the ADC circuit.

6. The method of claim 4, wherein the operating step further comprises determining an initial dynamic offset, wherein the adjustment of the electrical signal is dependent upon the initial dynamic offset, and wherein the adjusting step is repeated until each comparator output has reached or passed a desired threshold value.

7. The method of claim 6 wherein the electrical signal is a voltage coupled to an input of an amplifier of the ADC circuit.

8. The method of claim 4, wherein the adjustment of the electrical signal is dependent upon a present output of each comparator, the method further comprising:
   ceasing the repeating step when a predetermined number of adjustments have been performed.

9. The method of claim 8 wherein the electrical signal is a voltage coupled to an input of an amplifier of the ADC circuit.

10. A method of operating a data detection circuit, comprising:
    receiving an input data signal from a data storage medium;
    coupling the input data signal to a sampling circuit, the sampling circuit including a plurality of comparators; and
    intermittently individually calibrating at least one of the comparators, at least a portion of the calibration being performed while said at least one comparator is being clocked.

11. The method of claim 10, wherein said calibrating step calibrates dynamic offsets of the comparator.

12. The method of claim 11 wherein said plurality of comparators are intermittently calibrated.

13. The method of claim 10, said data detection circuit being a read channel circuit and said data storage medium being a disk storage medium, wherein said calibrating step calibrates dynamic offsets of the comparator, the method further comprising:

performing the calibrating step while said comparator is being operated at operating frequencies; and performing the calibrating step at intermittent periods which correspond to the beginning or ending of the sampling of a segment of data from the disk, each of the plurality of comparators being calibrated during the intermittent periods.

14. A comparator for use in an ADC, comprising:

a comparator input switchably coupled to an ADC data input and a reference voltage input;

a comparator output;

an amplifier coupled to the comparator input and the comparator output; and offset control circuitry, the offset control circuitry providing a comparator control loop, the offset control circuitry calibrating dynamic offsets between the reference voltage and a threshold voltage of the comparator while the comparator is operating.

15. The comparator of claim 14, further comprising:

a control node coupled to an input of the amplifier, an electrical parameter at the control node being adjusted to calibrate dynamic offsets of the comparator.

16. The comparator of claim 15, the electrical parameter being a voltage level that operates as an input of the amplifier.

17. The comparator of claim 14, the offset control circuitry detecting an offset voltage coupled to the output of the amplifier and adjusting a voltage level at a control node coupled to the input of the amplifier to calibrate the comparator.

18. The comparator of claim 17, the offset control circuitry comprising at least one capacitor switchably coupled to the control node for adjusting the voltage at the control node in response to the offset voltage detected.

19. The comparator of claim 18, the offset control circuitry further comprising at least one voltage source switchably coupled to the capacitor.

20. A data detection system, comprising:

an input coupled to a data storage medium, the input receiving a data stream from the data storage medium;

an analog to digital converter coupled to the input;

at least one reference voltage;

at least one comparator within the analog to digital converter;

an amplifier within the at least one comparator, at least one node of the comparator and the at least one reference voltage coupled to an input of the amplifier; and an offset control loop coupled to the at least one node and coupled to an output of the amplifier, the offset control loop operating while the comparator is being clocked to adjust an electrical parameter at the at least one node so that dynamic offsets between the at least one reference voltage and a threshold voltage of the comparator may be calibrated.

21. The data detection system of claim 20, the storage medium being a magnetic hard disk.

22. The data detection system of claim 21, the offset control loop comprising:

an offset detection circuit for determining the polarity of the dynamic offset of the comparator; and an adjustment circuit for adjusting the value of the electrical parameter at the at least one node in response to the dynamic offset detected by the offset detection circuit.

23. The data detection system of claim 22, the adjustment circuit comprising:

a capacitor switchably coupled to the at least one node; and at least one voltage source switchably coupled to the capacitor.

* * * * *